US012684926B2

(12) United States Patent
Blakely et al.

(10) Patent No.: US 12,684,926 B2
(45) Date of Patent: Jul. 14, 2026

(54) MULTIPLE WAVELENGTH LIGHT-EMITTING DIODE CHIP AND RELATED METHODS

(71) Applicant: CreeLED, Inc., Durham, NC (US)

(72) Inventors: Colin Blakely, Raleigh, NC (US); Michael Check, Holly Springs, NC (US); David Suich, Durham, NC (US); Andre Pertuit, Raleigh, NC (US); Robert Wilcox, Rolesville, NC (US)

(73) Assignee: CreeLED, Inc., Durham, NC (US)

( * ) Notice: Subject to any disclaimer, the term of this patent is extended or adjusted under 35 U.S.C. 154(b) by 575 days.

(21) Appl. No.: 18/165,720

(22) Filed: Feb. 7, 2023

(65) Prior Publication Data

US 2024/0266383 A1     Aug. 8, 2024

(51) Int. Cl.
| | |
|---|---|
| *H10H 29/14* | (2025.01) |
| *H10H 20/813* | (2025.01) |
| *H10H 20/821* | (2025.01) |
| *H10H 20/831* | (2025.01) |
| *H10H 20/855* | (2025.01) |
| *H10H 20/01* | (2025.01) |

(52) U.S. Cl.
CPC ........ *H10H 29/142* (2025.01); *H10H 20/813* (2025.01); *H10H 20/821* (2025.01); *H10H 20/8312* (2025.01); *H10H 20/855* (2025.01); *H10H 20/018* (2025.01); *H10H 20/032* (2025.01)

(58) Field of Classification Search
None
See application file for complete search history.

(56) References Cited

U.S. PATENT DOCUMENTS

| | | | | |
|---|---|---|---|---|
| 10,325,894 | B1 | 6/2019 | Pan | |
| 2015/0362165 | A1* | 12/2015 | Chu | H10H 20/825 |
| | | | | 362/235 |
| 2017/0179192 | A1* | 6/2017 | Zhang | H10H 29/142 |
| 2018/0114800 | A1 | 4/2018 | Pan | |
| 2019/0302917 | A1* | 10/2019 | Pan | G06F 3/044 |
| 2019/0319020 | A1* | 10/2019 | Pan | H10H 29/142 |

* cited by examiner

*Primary Examiner* — Bilkis Jahan
(74) *Attorney, Agent, or Firm* — Withrow & Terranova, P.L.L.C.

(57) ABSTRACT

Lighting-emitting devices and more particularly light-emitting diode (LED) chips with multiple wavelength emissions and related methods are disclosed. LED chips include separately formed active LED structures that are bonded together to form a single LED chip capable of emitting multiple wavelengths. Each active LED structure may be separately patterned into a number of individual light-emitting junctions such that after bonding, a single LED chip includes multiple light-emitting junctions from multiple active LED structures. Patterns of individual light-emitting junctions may be selected so that when bonded together, emissions from different active LED structures may pass through LED chips with reduced interactions with one another. Certain aspects include vertical and horizontal offset positions for light-emitting junctions formed from different active LED structures.

18 Claims, 20 Drawing Sheets

MULTIPLE WAVELENGTH LIGHT-EMITTING DIODE CHIP AND RELATED METHODS

FIELD OF THE DISCLOSURE

The present disclosure relates to lighting-emitting devices and, more particularly, to light-emitting diode (LED) chips with multiple wavelength emissions and related methods.

BACKGROUND

Light-emitting diodes (LEDs) are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions.

LEDs have been widely adopted in various illumination contexts, including general illumination and LED displays. For many LED applications, it is desirable to form multiple-colored LED groups to target intended emission characteristics. For example, individual LED chips or LED packages may be assembled near one another to provide primary colors red, green, and blue (RGB) that define vertices of a triangle (or polygon) on a chromaticity diagram. The area of the polygon defines a range of emissions colors, or color gamut, the device is capable of producing. Wider color gamut describes the capability of producing more colors than a device having a narrower color gamut. Despite recent advances, challenges exist in producing high quality light with desired emission characteristics while also providing high light emission efficiency in LED devices.

The art continues to seek improved LED devices capable of overcoming limitations associated with conventional devices.

SUMMARY

The present disclosure relates to lighting-emitting devices and, more particularly, to light-emitting diode (LED) chips with multiple wavelength emissions and related methods. LED chips include separately formed active LED structures that are bonded together to form a single LED chip capable of emitting multiple wavelengths. Each active LED structure may be separately patterned into a number of individual light-emitting junctions such that after bonding, a single LED chip includes multiple light-emitting junctions from multiple active LED structures. Patterns of individual light-emitting junctions may be selected so that when bonded together, emissions from different active LED structures may pass through LED chips with reduced interactions with one another. Certain aspects include vertical and horizontal offset positions for light-emitting junctions formed from different active LED structures.

In one aspect, an LED chip comprises: a first active LED structure comprising a first pattern of first light-emitting junctions that is configured to emit light of a first peak wavelength; and a second active LED structure on the first active LED structure, the second active LED structure comprising a second pattern of second light-emitting junctions that is configured to emit light of a second peak wavelength that is different than the first peak wavelength, the second light-emitting junctions being positioned vertically and horizontally offset from the first light-emitting junctions. In certain embodiments, the first light-emitting junctions and the second light-emitting junctions are positioned such that at least a portion of the light of the second peak wavelength is able to follow a direct path through the first active LED structure without passing through any of the first light-emitting junctions. In certain embodiments, the first pattern is inverse to the second pattern. In certain embodiments, each first light-emitting junction of the first pattern of first light-emitting junctions is individually controllable.

In certain embodiments, the first active LED structure comprises a first n-type layer and a first p-type layer, and each first light-emitting junction comprises a separate portion of the first n-type layer and a separate portion of the first p-type layer; and the second active LED structure comprises a second n-type layer and a second p-type layer, and each second light-emitting junction comprises a separate portion of the second n-type layer and a separate portion of the second p-type layer. In certain embodiments, the first n-type layer of the first active LED structure is continuous across the first light-emitting junctions, and the first p-type layer of the first active LED structure is discontinuous across the first light-emitting junctions. The LED chip may further comprise a third active LED structure on the second active LED structure, the third active LED structure comprising a third pattern of third light-emitting junctions that is configured to emit light of a third peak wavelength that is different than the first peak wavelength and the second peak wavelength, the third light-emitting junctions being positioned vertically and horizontally offset from both the first light-emitting junctions and the second light-emitting junctions. In certain embodiments, the first pattern, the second pattern, and the third pattern collectively form at least one of a grid pattern or a stripe pattern. In certain embodiments, a lateral width of the second light-emitting junctions is less than or equal to a lateral width of separation between neighboring ones of the first light-emitting junctions. The LED chip may further comprise a lumiphoric material registered with at least one of the first light-emitting junctions.

In another aspect, an LED chip comprises: a substrate; a first active LED structure on the substrate, the first active LED structure comprising a first pattern of first light-emitting junctions that is configured to emit light of a first peak wavelength; a second active LED structure on the first active LED structure, the second active LED structure comprising a second pattern of second light-emitting junctions that is configured to emit light of a second peak wavelength that is different than the first peak wavelength; and electrical connections to each of the first light-emitting junctions and each of the second light-emitting junctions, the electrical connections being arranged such that the first active LED structure and the second active LED structure are between the electrical connections and the substrate. In certain embodiments, the electrical connections comprise a plurality of p-contacts and a plurality of n-contacts, and each individual one of the first and second light-emitting junctions is electrically coupled to an individual p-contact of the plurality of p-contacts and an individual n-contact of the plurality of n-contacts. The LED chip may further comprise a passivation layer, wherein the plurality of p-contacts and the plurality of n-contacts are arranged to laterally extend on a surface of the passivation layer. The LED chip may further comprise at least one p-contact interconnect electrically coupled to each p-contact of the plurality of p-contacts, wherein the at least one p-contact interconnect extends through the passivation layer; and at least one n-contact interconnect electrically coupled to each n-contact of the plurality of n-contacts, wherein the at least one n-contact interconnect extends through the passivation layer. In certain embodiments, the first light-emitting junctions and the second light-emitting junctions are positioned such that at least a portion of the light of the second peak wavelength is able to follow a direct path through the first active LED structure without passing through any of the first light-emitting junctions. In certain embodiments: the first active LED structure comprises a first n-type layer and a first p-type layer, and each first light-emitting junction comprises a separate portion of the first n-type layer and a separate portion of the first p-type layer; and the second active LED structure comprises a second n-type layer and a second p-type layer, and each second light-emitting junction comprises a separate portion of the second n-type layer and a separate portion of the second p-type layer.

The LED chip may further comprise one or more contrast-enhancing layers arranged between neighboring ones of the first light-emitting junctions or between neighboring ones of the second light-emitting junctions, the one or more contrast-enhancing layers comprising light-absorbing materials or light-reflective materials. In certain embodiments, the one or more contrast-enhancing layers are arranged on sidewalls of the first light-emitting junctions or sidewalls of the first light-emitting junctions. In certain embodiments, the one or more contrast-enhancing layers are arranged to vertically extend distances that exceed thicknesses of the first light-emitting junctions or the second light-emitting junctions.

In another aspect, a method comprises: forming a first active light-emitting diode (LED) structure comprising a first n-type layer and a first p-type layer; patterning the first active LED structure to form a first pattern of first light-emitting junctions that is configured to emit light of a first peak wavelength; forming a second active LED structure comprising a second n-type layer and a second p-type layer; patterning the second active LED structure to form a second pattern of second light-emitting junctions that is configured to emit light of a second peak wavelength that is different than the first peak wavelength; and bonding the first active LED structure to the second active LED structure. In certain embodiments, forming the first active LED structure comprises forming the first n-type layer and the first p-type layer on a first growth substrate; forming the second active LED structure comprises forming the second n-type layer and the second p-type layer on a second growth substrate. The method may further comprise removing the first growth substrate after bonding the first active LED structure to the second active LED structure. The method may further comprise forming electrical connections to the first light-emitting junctions and to the second light-emitting junctions such that the first light-emitting junctions and the second light-emitting junctions are between the electrical connections and the second growth substrate. In certain embodiments, the second light-emitting junctions are positioned vertically and horizontally offset from the first light-emitting junctions.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

4

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 10E is a cross-sectional view of the LED chip of FIG. 10D at a subsequent fabrication step where a second etch mask is selectively formed over portions of the first active LED structure for further defining individual light-emitting junctions.

FIG. 10F is a cross-sectional view of the LED chip of FIG. 10E at a subsequent fabrication step where individual first light-emitting junctions are defined after a second etching step.

FIG. 10G is a cross-sectional view of the LED chip of FIG. 10F at a subsequent fabrication step after multiple passivation and metallization layers are formed to provide electrical connections to the light-emitting junctions.

DETAILED DESCRIPTION

Figure 1B:
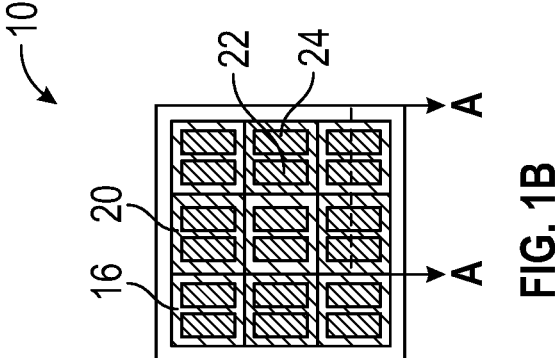
FIG. 1B is a view of the LED chip of FIG. 1A with the addition of a separate p-contact and a separate n-contact for each of the first and second light-emitting junctions.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to lighting-emitting devices and, more particularly, to light-emitting diode (LED) chips with multiple wavelength emissions and related methods. LED chips include separately formed active LED structures that are bonded together to form a single LED chip capable of emitting multiple wavelengths. Each active LED structure may be separately patterned into a number of individual light-emitting junctions such that after bonding, a single LED chip includes multiple light-emitting junctions from multiple active LED structures. Patterns of individual light-emitting junctions may be selected so that when bonded together, emissions from different active LED structures may pass through LED chips with reduced interactions with one another. Certain aspects include vertical and horizontal offset positions for light-emitting junctions formed from different active LED structures.

Before delving into specific details of various aspects of the present disclosure, an overview of various elements that may be included in exemplary LED packages of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light-transmissive optical properties.

Different embodiments of the active LED structure can emit different wavelengths of light depending on the composition of the active layer and n-type and p-type layers. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 650 nm. Other wavelength ranges include a range from 400 nm to about 430 nm and/or a range from 480 nm to 500 nm, among others, or any wavelength in a range from 400 nm to 750 nm. In certain embodiments, the active LED structure may be configured to emit light that is outside the visible spectrum, including one or more portions of the UV spectrum. The UV spectrum is typically divided into three wavelength range categories denoted with letters A, B, and C. In this manner, UV-A light is typically defined as a peak wavelength range from 315 nm to 400 nm, UV-B is typically defined as a peak wavelength range from 280 nm to 315 nm, and UV-C is typically defined as a peak wavelength range from 100 nm to 280 nm. UV LEDs are of particular interest for use in applications related to the disinfection of microorganisms in air, water, and surfaces, among others. In other applications, UV LEDs may also be provided with one or more lumiphoric materials to provide LED packages with aggregated emissions having a broad spectrum and improved color quality for visible light applications.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

Light-altering materials may be arranged within LED packages to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

An LED chip can also be covered or otherwise arranged to emit light toward one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, etc. In certain embodiments, aggregate emissions of LED chips, optionally in combination with one or more lumiphoric materials, may be arranged to provide cool white, neutral white, or warm white light, such as within a color temperature range of from 2500 Kelvin (K) to 10,000 K. In certain embodiments, lumiphoric materials having cyan, green, amber, yellow, orange, and/or red peak wavelengths may be used. In some embodiments, the combination of the LED chip and the one or more lumiphors (e.g., phosphors) emits a generally white combination of light. The one or more phosphors may include yellow (e.g., YAG:Ce), green (e.g., LuAg:Ce), and red (e.g., $Ca_{i-x-y}Sr_x$-$Eu_yAlSiN_3$) emitting phosphors, and combinations thereof.

Lumiphoric materials as described herein may include one or more of a phosphor, a scintillator, a lumiphoric ink, a quantum dot material, a day glow tape, and the like. Lumiphoric materials may be provided by any suitable means, for example, dispersal in a host material or an encapsulant material. In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. In certain embodiments, one or more lumiphoric materials may be arranged on or over one or more surfaces of an LED chip in a substantially uniform manner. In other embodiments, one or more lumiphoric materials may be arranged on or over one or more surfaces of an LED chip in a manner that is non-uniform with respect to one or more of material composition, concentration, and thickness. In certain embodiments, the loading percentage of one or more lumiphoric materials may be varied relative to one or more outer surfaces of an LED chip. In certain embodiments, one or more lumiphoric materials may be patterned relative to one or more surfaces of an LED chip to include one or more stripes, dots, curves, or polygonal shapes. In certain embodiments, multiple lumiphoric materials may be arranged in different discrete regions or discrete layers on or over an LED chip.

In certain embodiments, one or more lumiphoric materials may be provided as at least a portion of a wavelength conversion element or cover structure. Wavelength conversion elements or cover structures may include phosphor-in-glass or phosphor-in-ceramic arrangements. Phosphor-in-glass or ceramic arrangements may be formed by mixing phosphor particles with glass frit or ceramic materials, pressing the mixture into planar shapes, and firing or sintering the mixture to form a hardened structure that can be cut or separated into individual wavelength conversion elements. Wavelength conversion elements may be attached to one or more LED chips using, for example, a layer of transparent adhesive.

In certain aspects, the present disclosure is related to LED arrays for various applications, including color-changing lighting applications that may benefit from high precision and dynamic spectral tuning. Exemplary applications include emergency vehicular lighting (e.g., police, ambulance, fire trucks, etc.); multiple color projections of words, images or signs; navigational aids such as lighting for aircraft landing, airport control lighting, nautical buoys and beacons; lighting fixtures for photocatalytic reactions; patterned UV-curing of resins; patterned curing for three-dimensional printing applications; patterned photoresist curing for semiconductor applications; video screen projections; outdoor building lighting; and hand-held light sources such as flashlights and lanterns, among others.

In order to provide lighting with color-changing, dynamic spectral tuning, and the like, light sources having different emission wavelengths may be arranged in close proximity to one another. Conventional lighting devices for such applications typically include separately packaged LED components that are clustered together, where each separately packaged LED component may include a single LED chip or a grouping of different LED chips. However, each separately packaged LED component typically includes its own submount and encapsulant, thereby providing spatial limitations in how close the separately packaged LED components may be arranged together. Other conventional solutions include arrays of discrete LED chips that are assembled together on a common submount, such as a printed circuit board. However, size limitations related to placement of discrete LED chips and/or layouts of electrical connections on submounts can limit LED chip spacing.

According to aspects of the present disclosure, multiple-color LED chips are disclosed where a single multiple-color LED chip includes multiple epitaxial sections, or active LED structures, that are vertically and horizontally offset relative to one another. In one example, an LED chip includes at least two separate active LED structures that are vertically bonded to one another. A first active LED structure may be configured to emit light of a first wavelength and a second active LED structure may be configured to emit light of a second wavelength that is different than the first wavelength. In this manner, the first and second active LED structures may be separately formed before being joined together. In certain embodiments, the first active LED structure may be patterned into a plurality of first individual light-emitting junctions that are spaced apart from one another along the first active LED structure. The second active LED structure may also be patterned into a plurality of second individual light-emitting junctions with a pattern that is inverse to the pattern of the first light-emitting junctions. By inversing the patterns, the first and second active LED structures may be vertically bonded, and light emitted from the first light-emitting junctions may pass through propagation paths that extend between neighboring second light-emitting junctions. By forming the first light-emitting junctions from the first common active LED structure and the second light-emitting junctions from the second common active LED structure, spacing between junctions may not be limited by conventional devices that include separately formed LED chips.

Figure 1A:
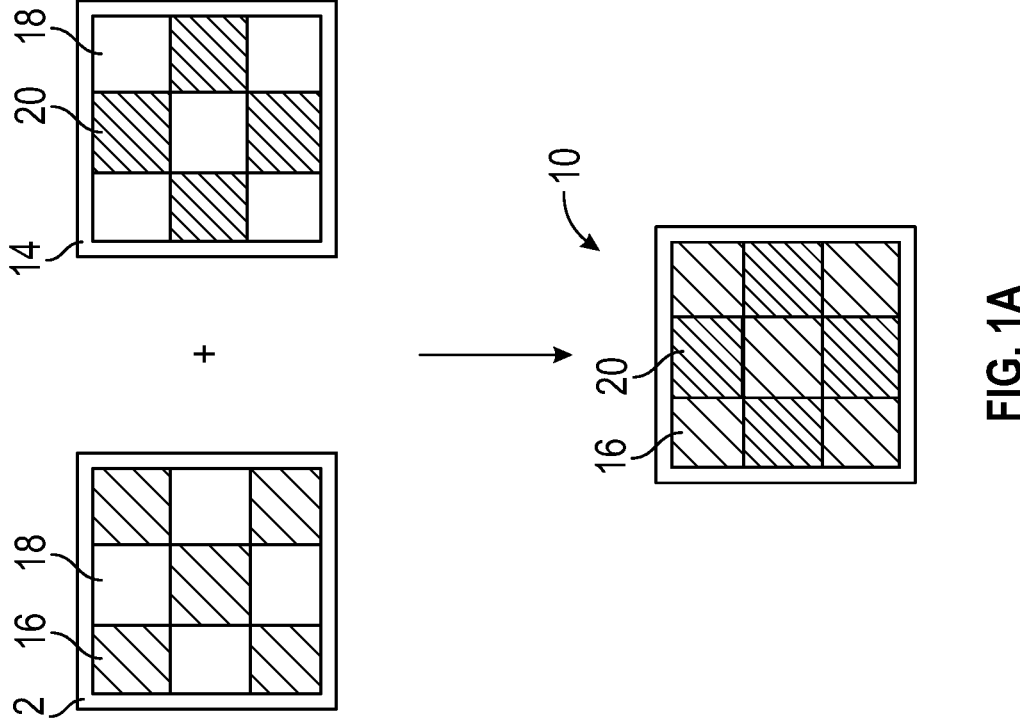
FIG. 1A is an exemplary fabrication sequence for forming a light-emitting diode (LED) chip that includes a first active LED structure and a second active LED structure that are separately formed and bonded to one another.

FIG. 1A is an exemplary fabrication sequence for forming an LED chip 10 that includes a first active LED structure 12 and a second active LED structure 14 that are separately formed and bonded to one another. The first active LED structure 12 may be patterned into multiple first light-emitting junctions 16 that are spaced apart from one another by voids 18. The first light-emitting junctions 16 may be formed by a selective removal process, such as patterned etching, that removes portions of the first active LED structure 12 at the voids 18. In a similar manner, the second active LED structure 14 may be patterned into multiple second light-emitting junctions 20 that are also spaced apart from one another by voids 18. As illustrated, the pattern of the second light-emitting junctions 20 may be inverse to the pattern of the first light-emitting junctions 16. In this manner, when the first and second active LED structures 12, 14 are vertically stacked together to form the LED chip 10, the second light-emitting junctions 20 are horizontally offset from the first light-emitting junctions 16 from the top view provided in FIG. 1A. In this manner, the second light-emitting junctions 20 may be vertically aligned or registered with the voids 18 of the overlying first active LED structure 12 so that light from the second light-emitting junctions 20 may escape the LED chip 10 with reduced absorption relative to the first light-emitting junctions 16.

FIG. 1B is a view of the LED chip 10 of FIG. 1A with the addition of a separate p-contact 22 and a separate n-contact 24 for each of the first and second light-emitting junctions 16, 20. By providing the separate p-contact 22, or anode contact, and the separate n-contact 24, or cathode contact, for each individual light-emitting junction, individually addressable control may be realized. As such, each individual first light-emitting junction 16 and each individual second light-emitting junction 20 may be controlled independently from one another. In other embodiments, common anodes and/or common cathode connections may be provided for multiple ones of the first and/or second light-emitting junctions 16, 20. In certain embodiments, the LED chip 10 may include a flip-chip structure that is arranged for flip-chip mounting to another surface, such as a submount or printed circuit board. For flip-chip configurations, the p-contacts 22 and n-contacts 24 are arranged on a mounting face of the LED chip 10.

Figures 2, 3:
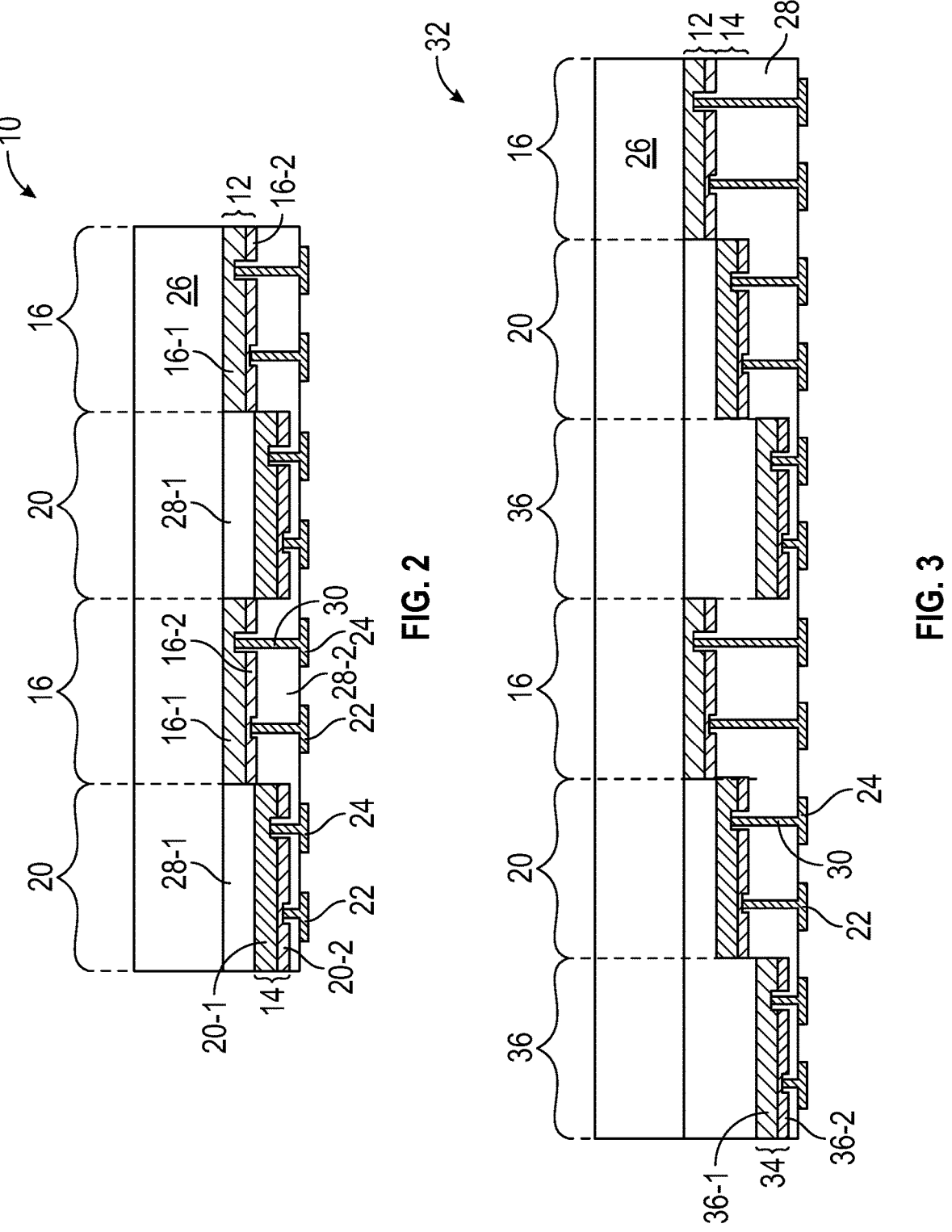
FIG. 2 is a cross-sectional view of a portion of the LED chip of FIG. 1B taken along the sectional line A-A of FIG. 1B.
FIG. 3 is a cross-sectional view of a portion of an LED chip that is similar to the LED chip of FIG. 2 and further includes a third active LED structure that is patterned to form multiple third light-emitting junctions.

FIG. 2 is a cross-sectional view of a portion of the LED chip 10 of FIG. 1B taken along the sectional line A-A of FIG. 1B. As illustrated, the first active LED structure 12 may be arranged on a substrate 26, and the second active LED structure 14 may be arranged on the first active LED structure 12 in a vertical direction from the substrate 26. In FIG. 2, the first light-emitting junctions 16 are illustrated with an n-type layer 16-1 and a p-type layer 16-2. It is understood many more layers may be present, including an active layer between the p-n junction formed by the n-type layer 16-1 and the p-type layer 16-2. In a similar manner, the second light-emitting junctions 20 are illustrated with an n-type layer 20-1 and a p-type layer 20-2, although many more layers may be present, including an active layer between the p-n junction formed by the n-type layer 20-1 and the p-type layer 20-2. The first and second active LED structures 12, 14 may each be configured to emit different peak wavelengths of light from one another, such as different ones of blue, green, and/or red wavelengths, among other combinations. In certain embodiments, the peak wavelengths may differ by as little as 3 nm, or in a range from 3 nm to 50 nm, or in a range from 3 nm to 250 nm, among other ranges.

The substrate 26 may embody a growth substrate for the first active LED structure 12. That is, the first active LED structure 12 may be epitaxially grown on the substrate 26 and subsequently patterned to form the first light-emitting junctions 16. The second active LED structure 14 may be separately formed and then bonded on the first light active LED structure 12. After patterning the first light-emitting junctions 16, a passivation layer 28-1 may be formed to fill the voids (i.e., 18 of FIG. 1A) in the first active LED structure 12. In a similar manner, another passivation layer 28-2 may fill the voids in the second active LED structure 14. The p- and n-contacts 22, 24 may be electrically coupled to corresponding first or second light-emitting junctions 16, 20 by way of electrically conductive vias 30, or n-contact and p-contact interconnects, that extend through the passivation layers 28-1, 28-2. With such an arrangement, the second light-emitting junctions 20 are positioned vertically and horizontally offset from the first light-emitting junctions 16. This allows at least a portion of light emitted by the second light-emitting junctions 20 to be able to follow a direct and straight-line path through the first active LED structure 12 without passing through any of the first light-emitting junctions 16. For flip-chip configurations, the direct and straight-line path may traverse through the substrate 26. In certain embodiments, the pattern of the second light-emitting junctions 20 is inverse to the pattern of the first light-emitting junctions 16. By forming the first light-emitting junctions 16 from a common first active LED structure 12 and the second light-emitting junctions 20 from a common second active LED structure 14, lateral spacing between junctions may be reduced. For example, a lateral spacing between each first light-emitting junction 16 and the next-adjacent second light-emitting junction 20 may be about 5 microns (μm), or in a range from 5 μm to 20 μm, or in a range from 5 μm to 45 μm.

FIG. 3 is a cross-sectional view of a portion of an LED chip 32 that is similar to the LED chip 10 of FIG. 2 and further includes a third active LED structure 34 that is patterned to form multiple third light-emitting junctions 36. The third active LED structure 34 may be formed and patterned in a similar manner as described above for the second active LED structure 14. The first, second, and third active LED structures 12, 14, 34 may each be configured to emit different peak wavelengths of light from one another, such as blue, green, and red wavelengths, among other combinations. The third active LED structure 34 may be separately formed and attached to the second active LED structure 14. The third active LED structure 34 is drawn with an n-type layer 36-1 and a p-type layer 36-2, although other layers such as an active layer may also be present. As illustrated, the third light-emitting junctions 36 may be positioned vertically and horizontally offset from the both the first and second light-emitting junctions 16, 20 to allow direct and straight-line paths of light to escape the LED chip 32 with reduced absorption by the first and second light-emitting junctions 16, 20. One or more of the passivation layers 28-1, 28-2 may fill voids through the first, second, and third active LED structures 12, 14, 34.

Various patterns of light-emitting junctions may be provided that target various emission patterns for multiple-junction LED chips. Arrangements of different wavelength emitting junctions may be provided to enhance color mixing so that aggregate emissions appear uniform, or to mimic the appearance of a single LED chip, while still being able to dynamically change the aggregate emission color. Patterns include checkerboard, stripe, and various grid arrangements of multiple colors. While the embodiments disclosed herein are illustrated in the context of square or rectangular light-emitting junctions, other shapes such as hexagonal, circular, and triangular are also contemplated. FIGS. 4A to 9 illustrate various examples of patterns that may be implemented. It is understood the exemplary patterns shown for each LED chip of FIGS. 4A to 9 may be repeated to form larger area LED chips.

Figure 4A:
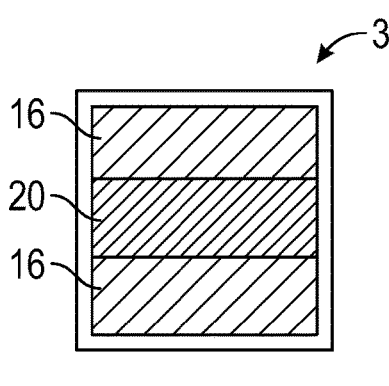
FIG. 4A is a view of an LED chip that is similar to the LED chip of FIG. 1A for embodiments where the first light-emitting junctions and one of the second light-emitting junctions are arranged in a stripe pattern.
Figure 4B:
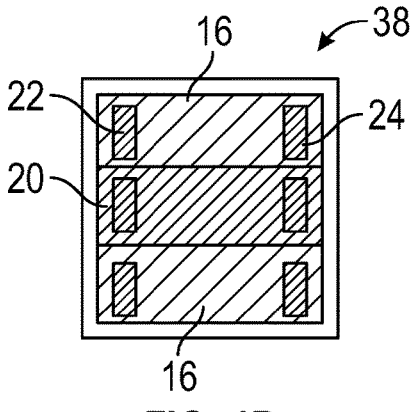
FIG. 4B is a view of the LED chip of FIG. 4A with the addition of n- and p-contacts.

FIG. 4A is a view of an LED chip 38 that is similar to the LED chip 10 of FIG. 1A for embodiments where the first light-emitting junctions 16 and one of the second light-emitting junctions 20 are arranged in a stripe pattern. FIG. 4B is a view of the LED chip 38 of FIG. 4A with the addition of p- and n-contacts 22, 24. By having the stripe pattern where the first and second light-emitting junctions 16, 20 may extend from one peripheral edge to an opposing peripheral edge of the LED chip 38, pairs of the p- and n-contacts 22, 24 for each light-emitting junction may also be arranged on opposing peripheral edges of the LED chip 38. While only a single one of the second light-emitting junctions 20 is shown, multiple ones of the second light-emitting junctions 20 may be formed in stripes in an alternating manner with the first light-emitting junctions 16.

Figure 5:
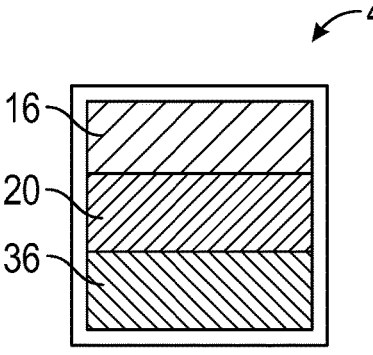
FIG. 5 is a view of an LED chip that is similar to the LED chip of FIG. 4A for embodiments that further include at least one of the third light-emitting junctions.

FIG. 5 is a view of an LED chip 40 that is similar to the LED chip 38 of FIG. 4A for embodiments that further include at least one of the third light-emitting junctions 36. In this manner, the first, second, and third light-emitting junctions 16, 20, 36 may be formed in stripe patterns across the LED chip 40. While only one of each type of light-emitting junction is shown, multiple ones of each of the first, second, and third light-emitting junctions 16, 20, 36 may be formed in an alternating stripe pattern across the LED chip 40.

Figure 6:
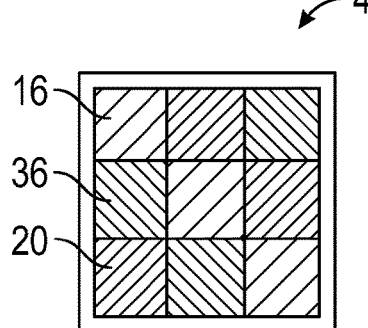
FIG. 6 is a view of an LED chip that is similar to the LED chip of FIG. 1A for embodiments that further include multiple ones of the third light-emitting junctions.

FIG. 6 is a view of an LED chip 42 that is similar to the LED chip 10 of FIG. 1A for embodiments that further include multiple ones of the third light-emitting junctions 36. As illustrated, the first, second, and third light-emitting junctions 16, 20, 36 may form a grid pattern to provide enhanced color mixing. In certain embodiments, as the pattern progresses horizontally along a row or vertically along a column, the first, second, and third light-emitting junctions 16, 20, 36 are each present before a same color one is repeated along a column or a row.

Figure 7:
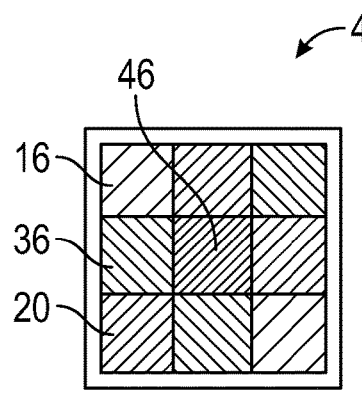
FIG. 7 is a view of an LED chip that is similar to the LED chip of FIG. 6 for embodiments that further include at least one lumiphoric material.

FIG. 7 is a view of an LED chip 44 that is similar to the LED chip 42 of FIG. 6 for embodiments that further include at least one lumiphoric material 46. For example, the LED chip 44 may have the lumiphoric material 46 arranged over a middle one of the first light-emitting junctions 16. In this manner, the first light-emitting junction 16 that is covered by the lumiphoric material 46 may provide a different emission color, such as generally white light, than others of the first light-emitting junctions 16 that are not covered by the lumiphoric material 16. Combined with the second and third light-emitting junctions 20, 36, the LED chip 44 may accordingly be capable of emitting four different emission colors that may be individually controlled. In certain embodiments, the centrally located lumiphoric material 46 is positioned close to each of the single-color light-emitting junctions 16, 20, 36 to improve color mixing and be able to effectively tune the aggregate white color by adjusting relative intensities of the nearby single-color emissions. In other embodiments, the lumiphoric material 46 may also be arranged to cover other light-emitting junctions and/or be positioned in other locations of the LED chip 44.

Figure 8:
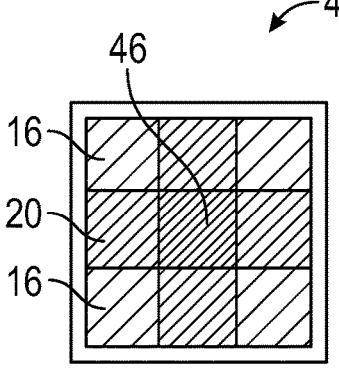
FIG. 8 is a view of an LED chip that is similar to the LED chip of FIG. 7 for embodiments that include the lumiphoric material and only the first and second light-emitting junctions.

FIG. 8 is a view of an LED chip 48 that is similar to the LED chip 44 of FIG. 7 for embodiments that include the lumiphoric material 46 and only the first and second light-emitting junctions 16, 20. Again, the lumiphoric material 46 is illustrated to cover one of the first light-emitting junctions 16 at a center of the LED chip 48. However, other locations and additional lumiphoric materials 46 may also be arranged as described above for FIG. 7.

Figure 9:
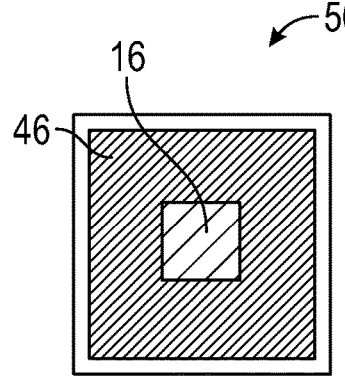
FIG. 9 is a view of an LED chip that is similar to the LED chip of FIG. 8 for embodiments where the lumiphoric material is arranged to cover larger areas of the LED chip.

FIG. 9 is a view of an LED chip 50 that is similar to the LED chip 48 of FIG. 8 for embodiments where the lumiphoric material 46 is arranged to cover larger areas of the LED chip 50. In certain embodiments, the lumiphoric material 46 may laterally extend to cover multiple light-emitting junctions, such as multiple first and/or second light-emitting junctions (e.g., 16, 20 of FIG. 8). In other embodiments, the entire area covered by the lumiphoric material 46 in FIG. 9 may correspond to a single one of the light-emitting junctions, such as the second light-emitting junction 20 of previous embodiments.

Figures 10A, 10B:
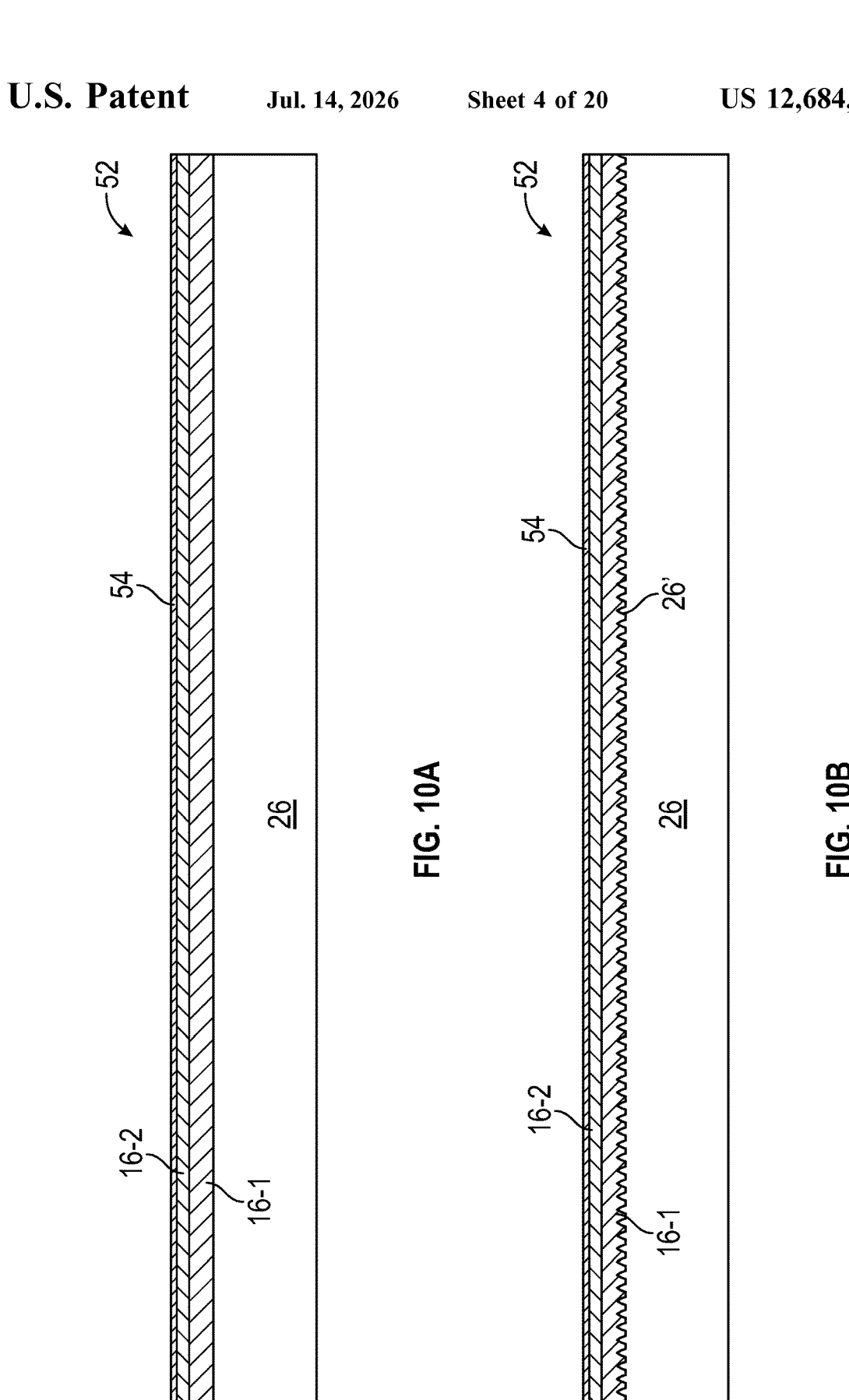
FIG. 10A is a cross-sectional view of an LED chip that is similar to the LED chip of FIG. 2 at a fabrication step where a first active LED structure is formed on a substrate.
FIG. 10B is a cross-sectional view of the LED chip of FIG. 10A illustrating an alternative arrangement for the substrate.
Figures 10C, 10D:
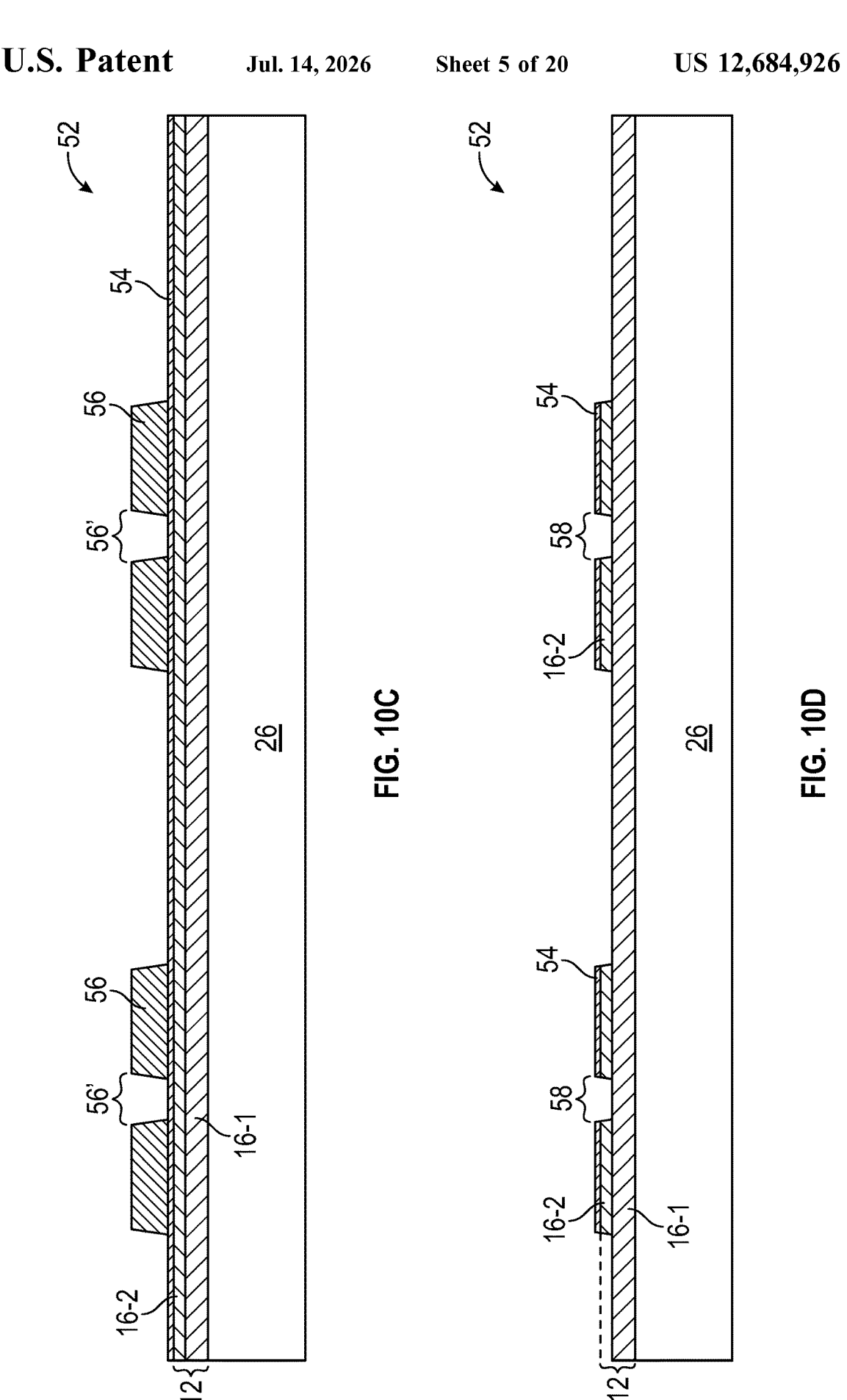
FIG. 10C is a cross-sectional view of the LED chip of FIG. 10A at a subsequent fabrication step where a first etch mask is formed on the first active LED structure.
FIG. 10D is a cross-sectional view of the LED chip of FIG. 10C at a subsequent fabrication step where a first etching step is complete.
Figures 10E, 10F:
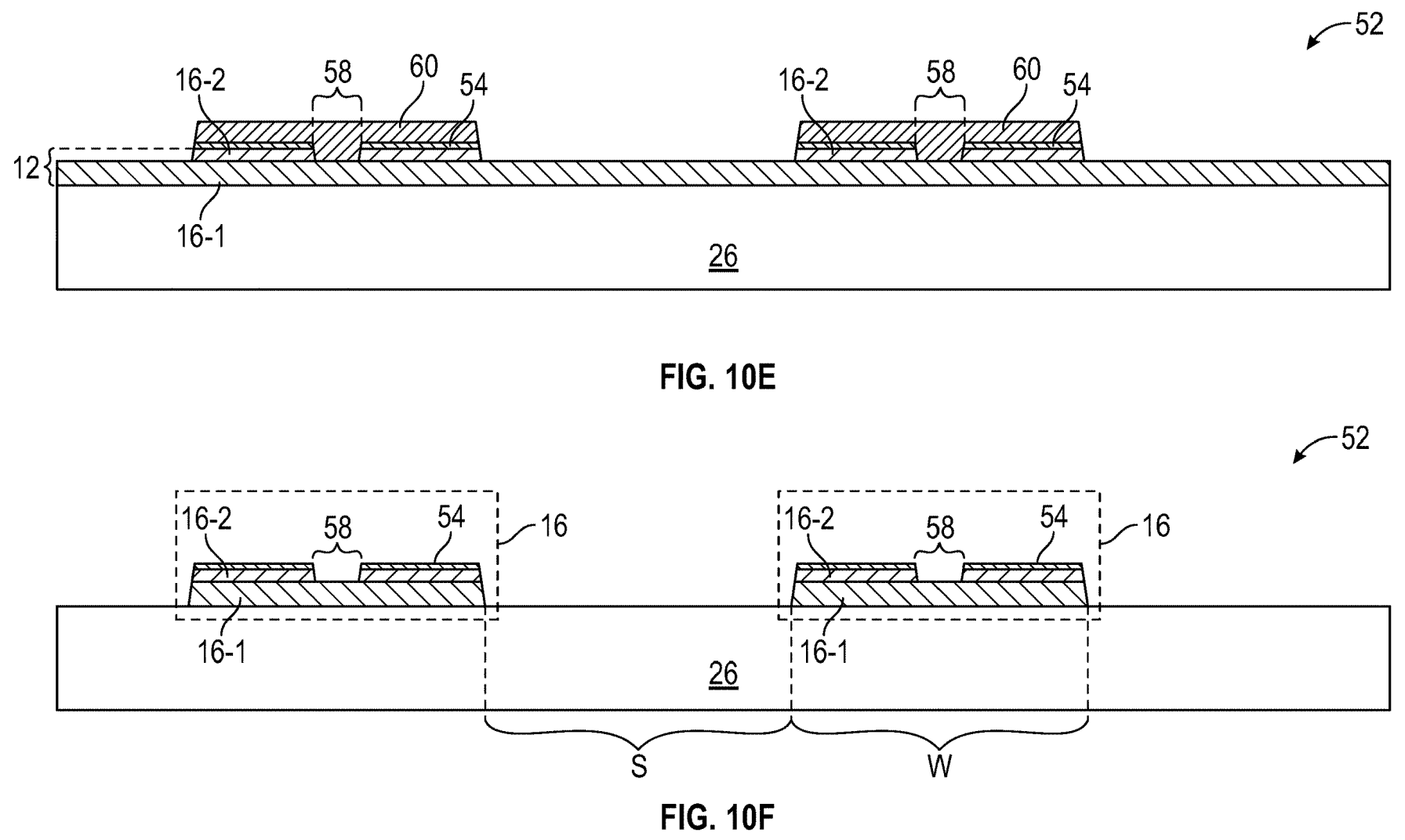
Figure 10G:
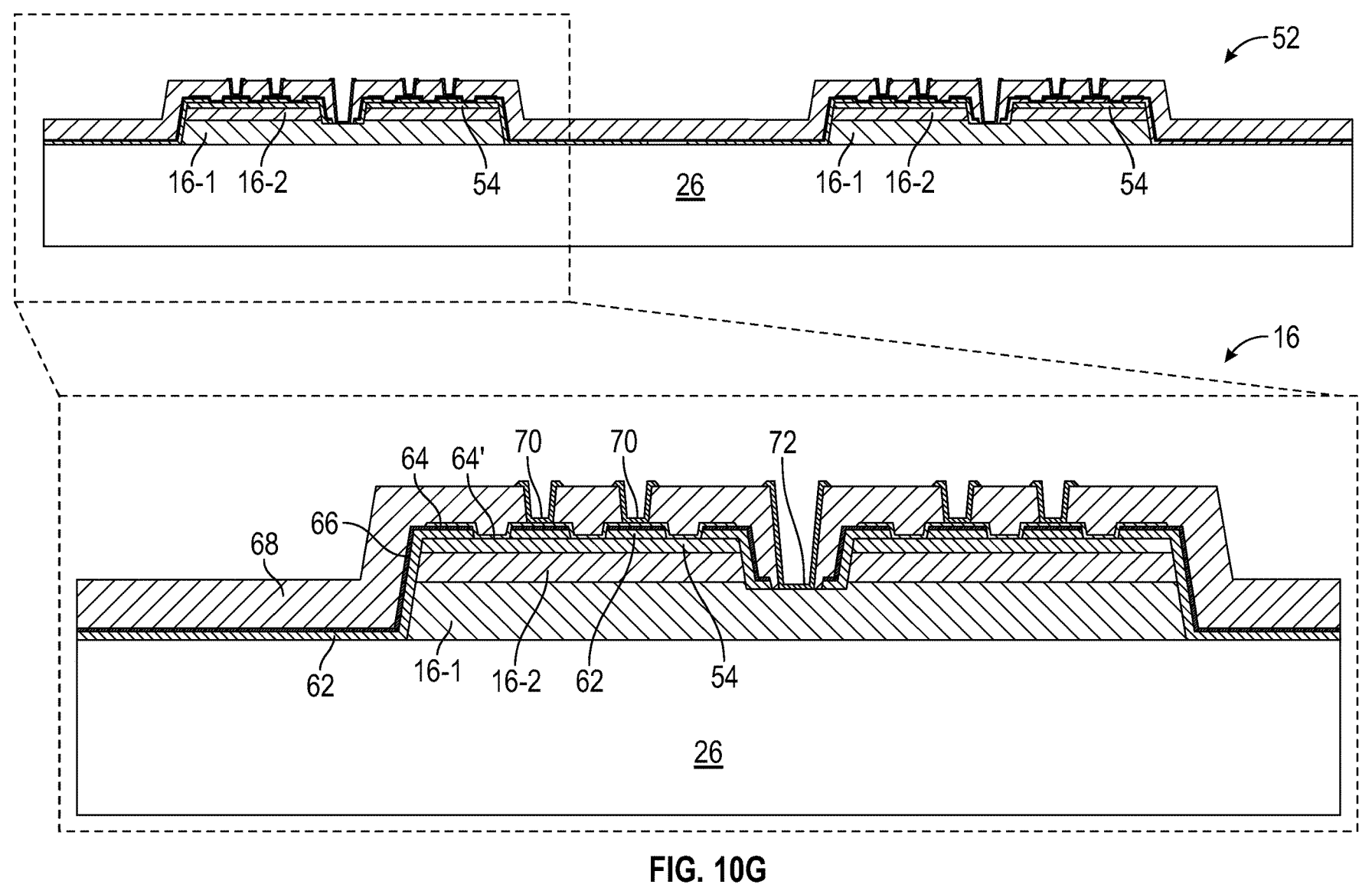
Figure 10H:
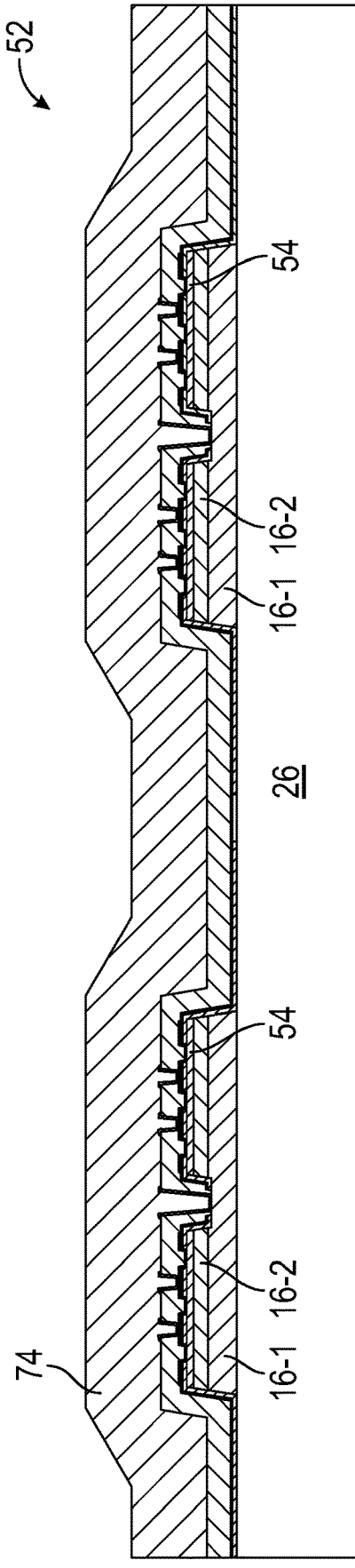
FIG. 10H is a cross-sectional view of the LED chip of FIG. 10G at a subsequent fabrication step after a second passivation layer is formed on the LED chip.
Figure 10I:
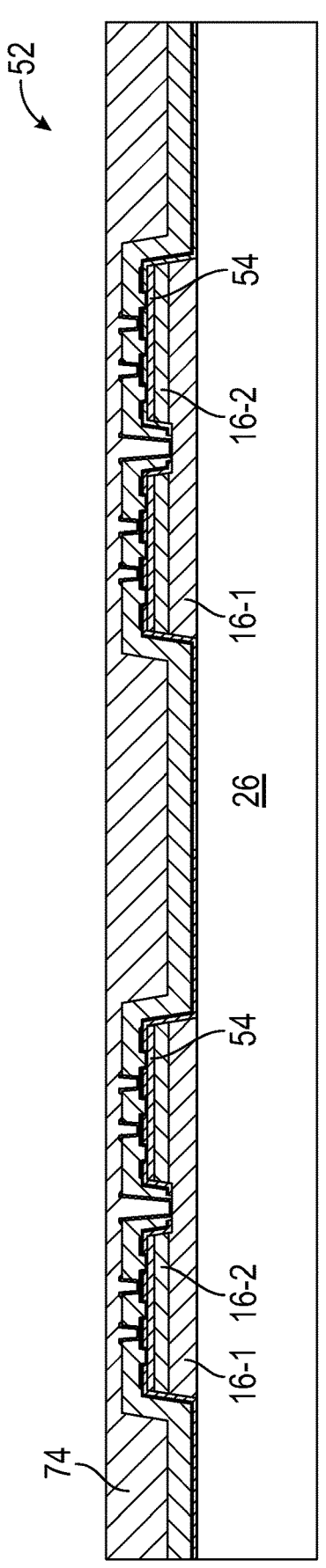
FIG. 10I is a cross-sectional view of the LED chip of FIG. 10H at a subsequent fabrication step after planarization of the second passivation layer.
Figures 10J, 10K:
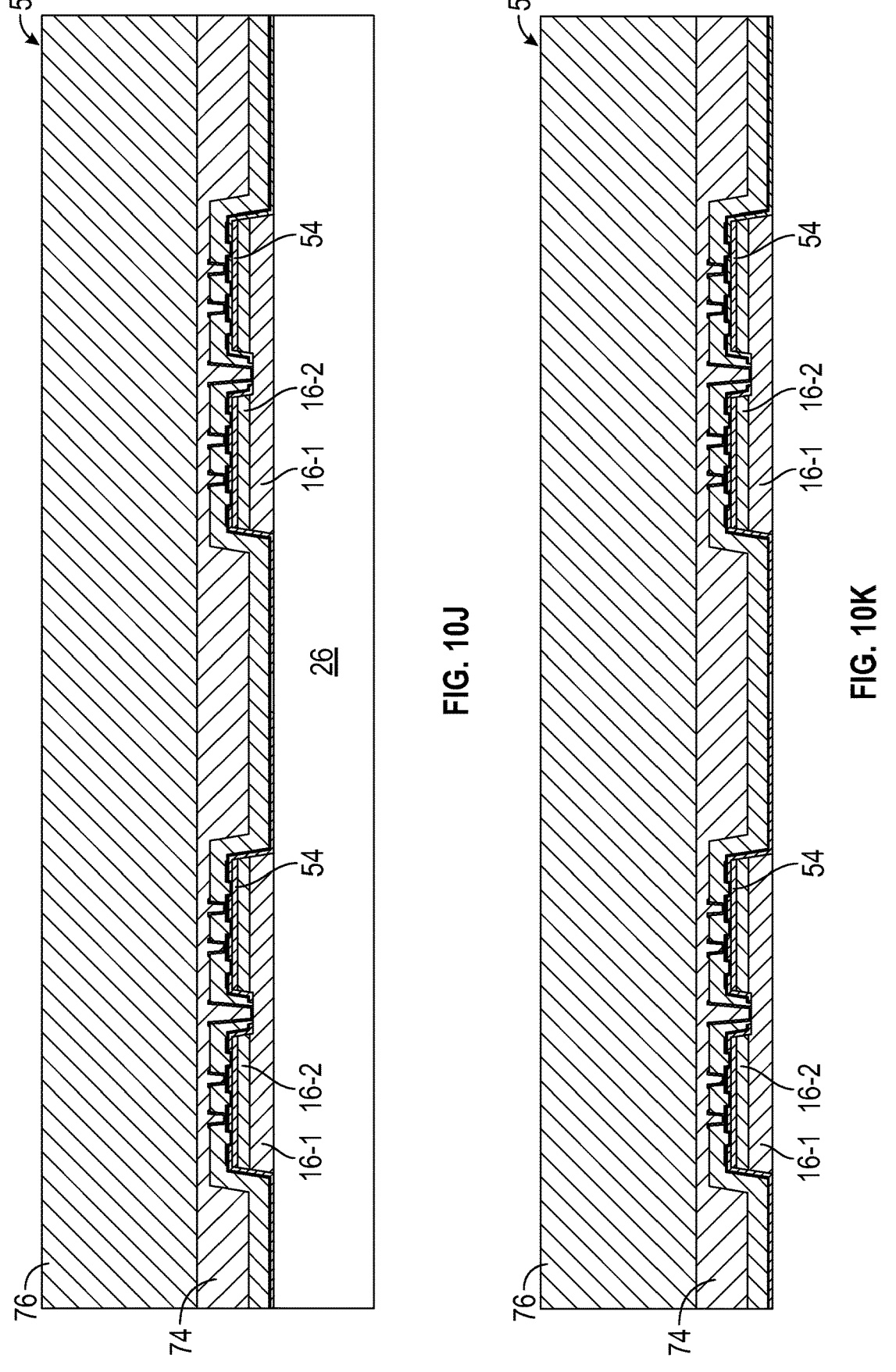
FIG. 10J is a cross-sectional view of the LED chip of FIG. 10I at a subsequent fabrication step after bonding to a temporary substrate.
FIG. 10K is a cross-sectional view of the LED chip of FIG. 10J at a subsequent fabrication step after removal of the substrate.
Figure 10L:
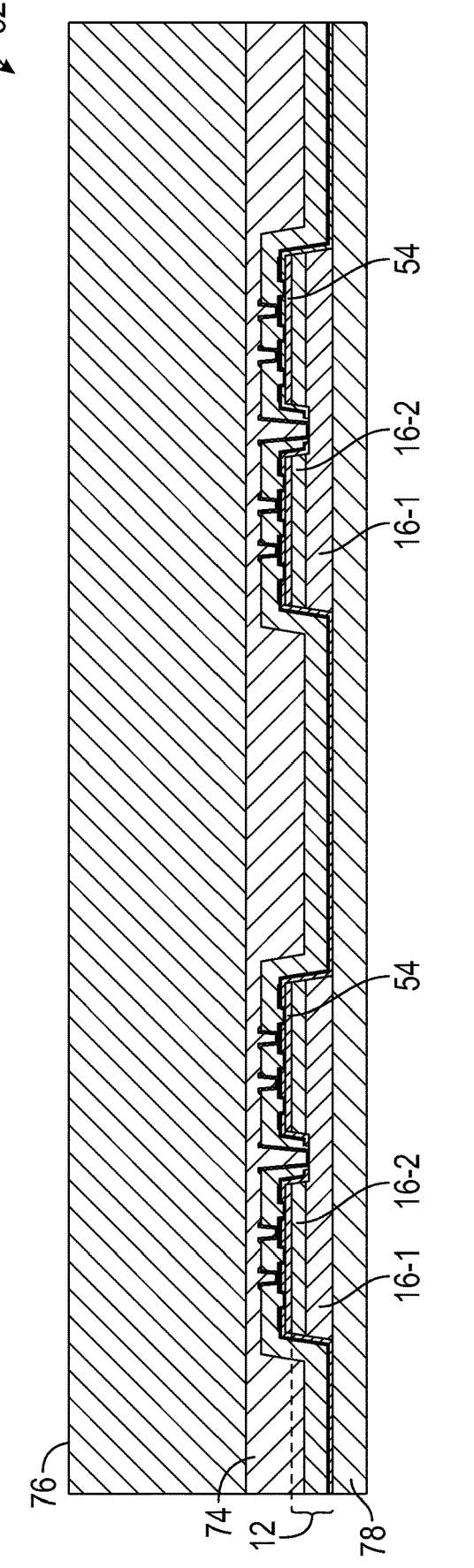
FIG. 10L is a cross-sectional view of the LED chip of FIG. 10K at a subsequent fabrication step after a first bonding layer is formed.
Figure 10M:
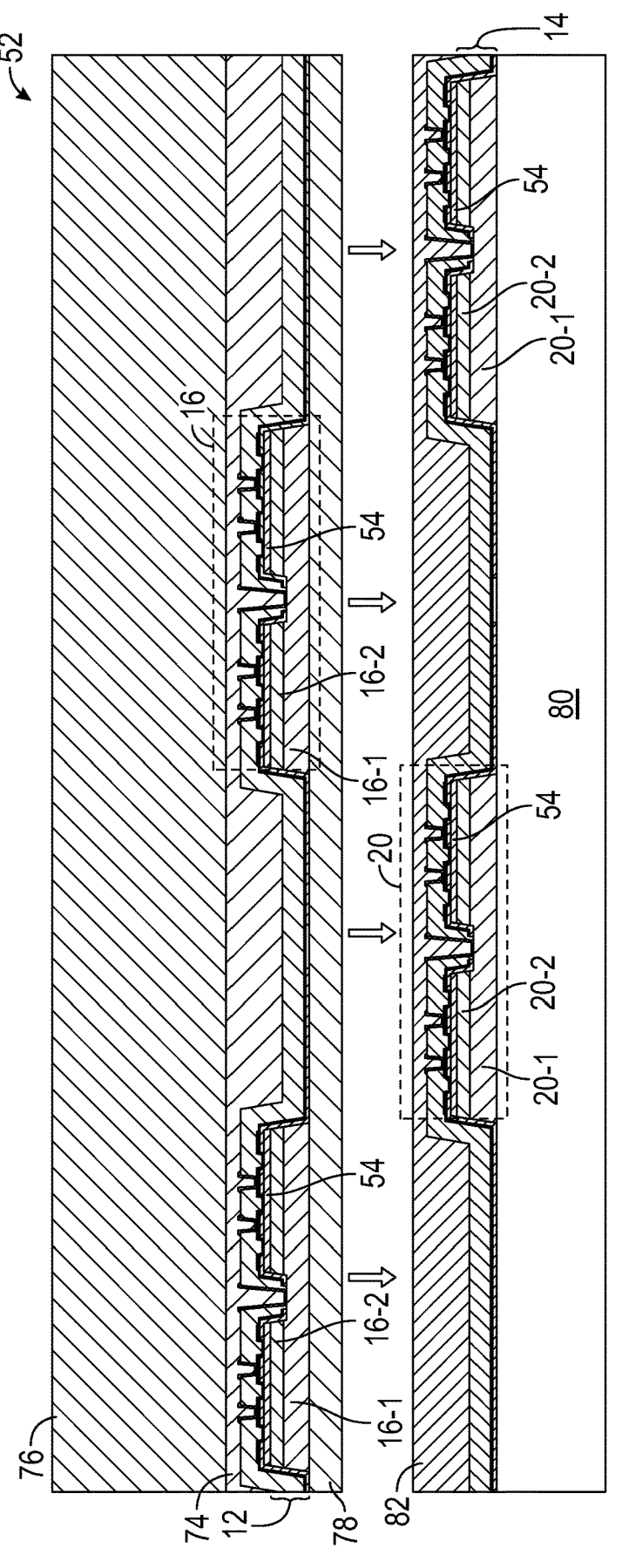
FIG. 10M is a cross-sectional view of the LED chip of FIG. 10L at a subsequent fabrication step for bonding the first active LED structure to the second active LED structure.
Figure 10N:
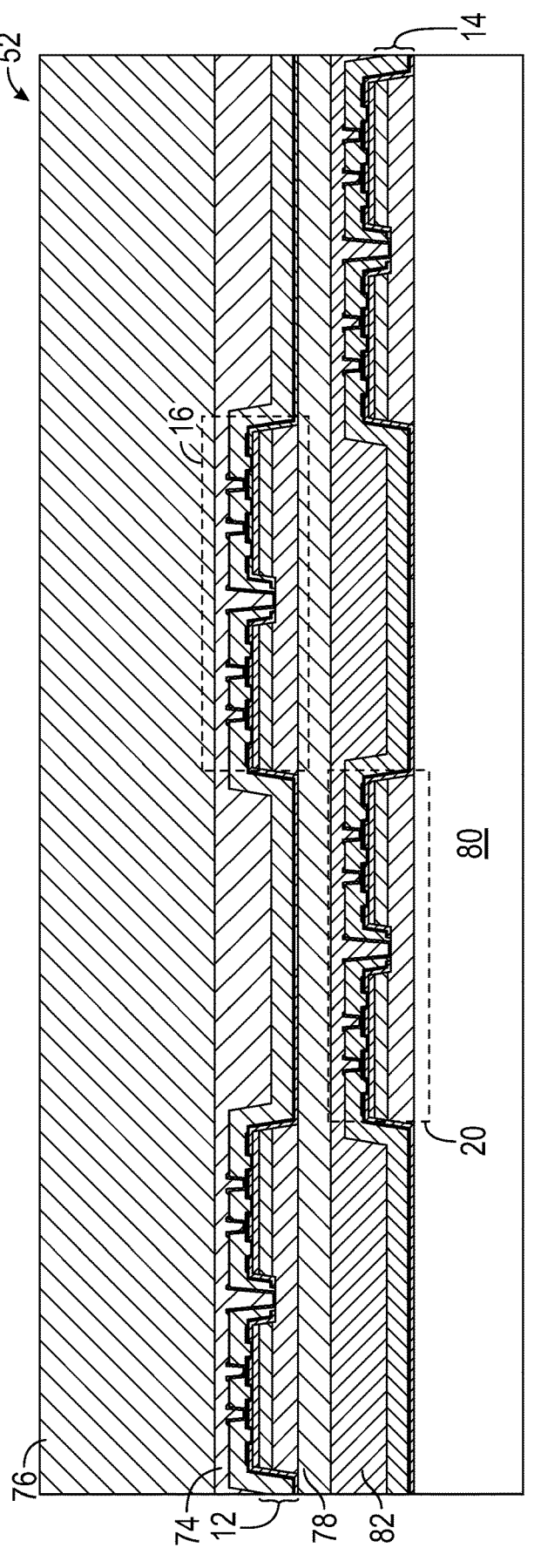
FIG. 10N is a cross-sectional view of the LED chip of FIG. 10M at a subsequent fabrication step after bonding the first active LED structure to the second active LED structure.
Figure 10O:
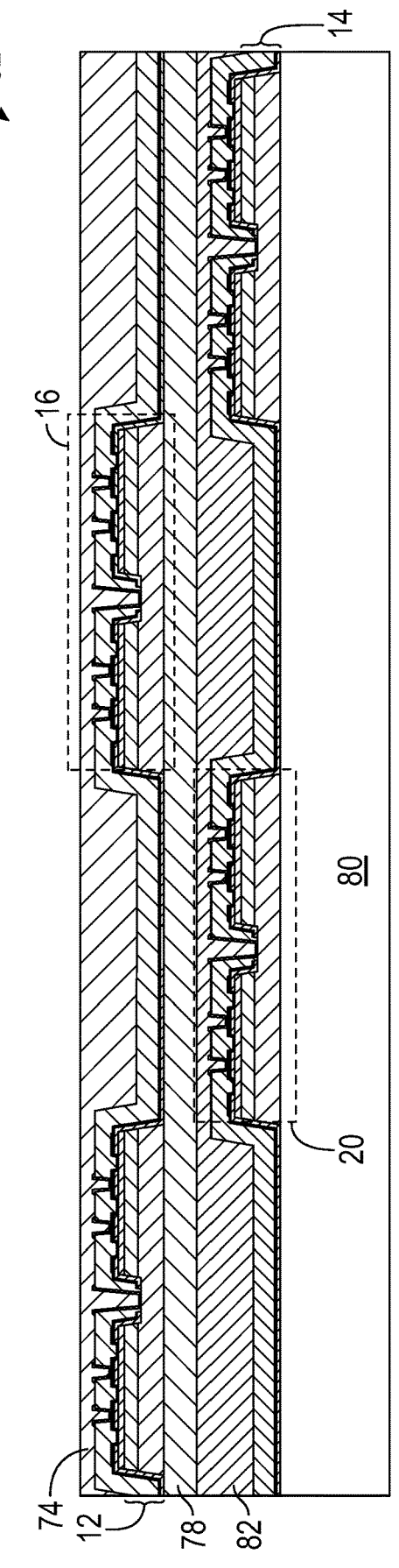
FIG. 10O is a cross-sectional view of the LED chip of FIG. 10N at a subsequent fabrication step after removal of the temporary substate.
Figure 10P:
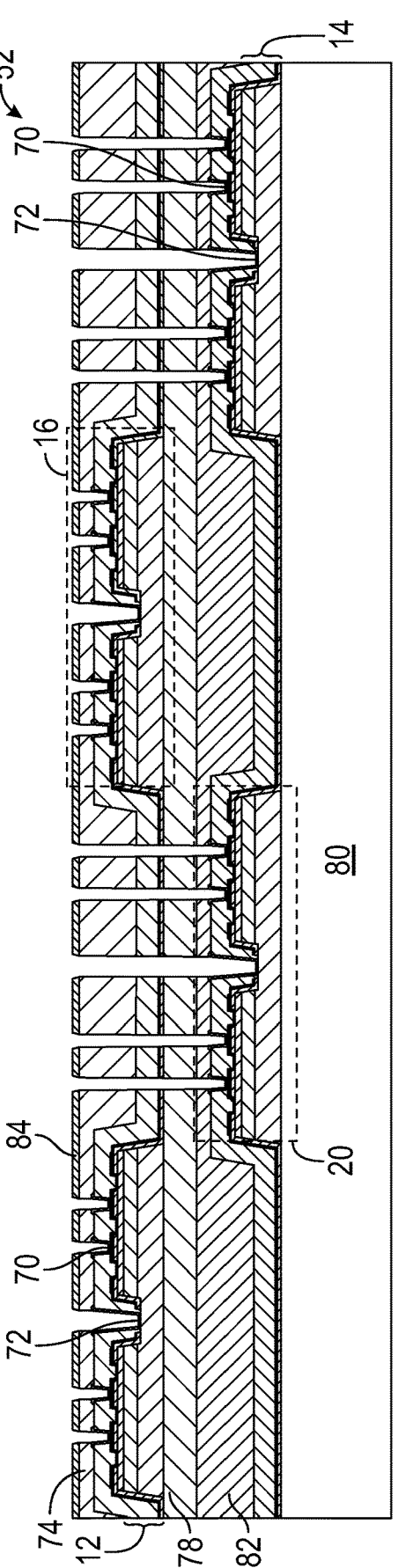
FIG. 10P is a cross-sectional view of the LED chip of FIG. 10O at a subsequent fabrication step after etching is performed through a third etch mask to provide openings through the second passivation layer to provide access to the first and second active LED structures.
Figure 10Q:
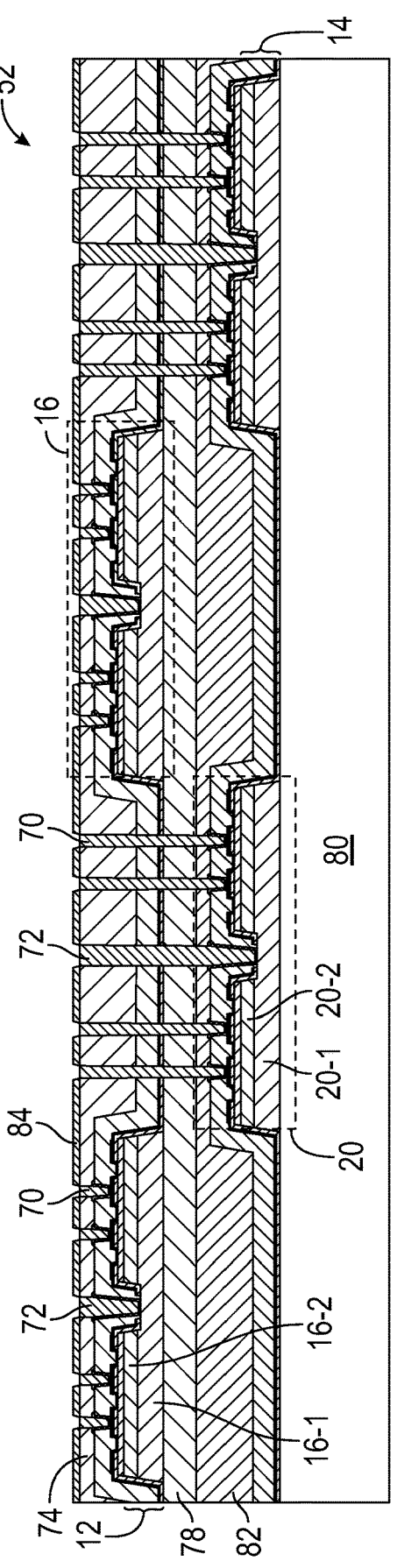
FIG. 10Q is a cross-sectional view of the LED chip of FIG. 10P at a subsequent fabrication step after electrically conductive vias are formed through the openings formed in the etching step of FIG. 10P.
Figure 10R:
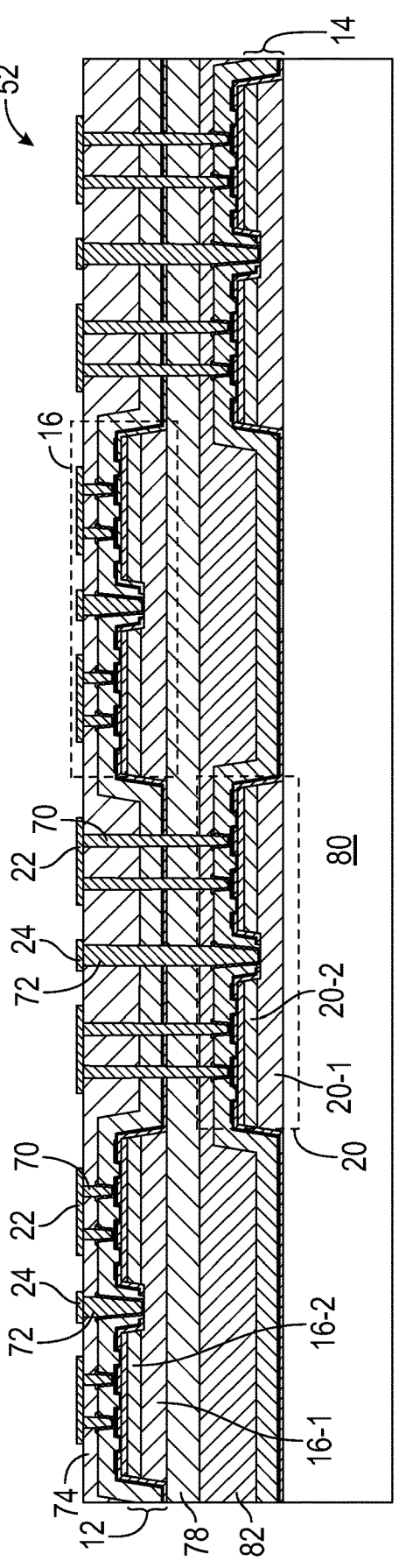
FIG. 10R is a cross-sectional view of the LED chip of FIG. 10Q at a subsequent fabrication step after p-contacts and n-contacts have respectively been coupled to p-contact interconnects and n-contact interconnects.

FIGS. 10A to 10R illustrate detailed cross-sectional views at various fabrication steps for forming an LED chip 52 according to principles of the present disclosure. The LED chip 52 is described in the context of two active LED structures in a similar manner as the LED chip 10 of FIG. 2. However, the principles disclosed are scalable to additional active LED structures, such as the LED chip 32 of FIG. 3.

FIG. 10A is a cross-sectional view of the LED chip 52 at a fabrication step where the first active LED structure 12 is formed on the substrate 26. In certain embodiments, the first active LED structure 12 is epitaxially grown by sequentially forming the n-type layer 16-1 and the p-type layer 16-2. Of course, many other epitaxial layers may also be present, including an active layer formed between the n-type layer 16-1 and the p-type layer 16-2. After epitaxial growth, the active LED structure 12 may continuously cover the substrate 26. In certain embodiments, a current spreading layer 54 may be formed to cover the p-type layer 16-2. The current spreading layer 54 may include a thin layer of a transparent conductive oxide such indium tin oxide (ITO) or a metal such as platinum (Pt), although other materials may be used.

FIG. 10B is a cross-sectional view of the LED chip 52 of FIG. 10A illustrating an alternative arrangement for the substrate 26. In certain embodiments, the substrate 26 may embody a patterned substrate where a growth face thereof includes nonplanar features 26'. The nonplanar features 26' may include a pattern of protrusions and/or depressions that promote enhanced light extraction through the interface between the substrate 26 and the first active LED structure 12. While the remaining FIGS. 10C to 10R are provided in the context of the substrate 26 of FIG. 10A, the substrate 26 for each of FIGS. 10C to 10R may also include the nonplanar features 26'. In certain embodiments, the substrate 26 is a patterned sapphire substrate.

FIG. 10C is a cross-sectional view of the LED chip 52 of FIG. 10A at a subsequent fabrication step where a first etch mask 56 is formed on the first active LED structure 12. The first etch mask 56 may be selectively formed to initially define areas where individual light-emitting junctions will be formed from the first active LED structure 12. For illustrative purposes, the first etch mask 56 is provided over what will become two light-emitting junctions. However, it is understood that any number of light-emitting junctions may be defined. The first etch mask 56 may be arranged with one or more openings 56' that will later define one or more electrically conductive pathways to the n-type layer 16-1 of each light-emitting junction. The one or more openings 56' may embody holes that extend through an entire thickness of the first etch mask 56. In certain embodiments, the cross-sectional view of FIG. 10C extends through a center of the openings 56' and it is understood portions of the first etch mask 56 may extend in a continuous manner around a perimeter of the openings 56' outside a plane of the cross-sectional view.

FIG. 10D is a cross-sectional view of the LED chip 52 of FIG. 10C at a subsequent fabrication step where a first etching step is complete. As illustrated, the first etching step removes portions of the current spreading layer 54 and the p-type layer 16-2 that were uncovered by the first etch mask 56 of FIG. 10C. The first etching step further extends into a portion of the n-type layer 16-1. One or more first openings 58 of the active LED structure 12 are formed at locations of the openings 56' of the first etch mask 56 of FIG. 10C. The first openings 58 may extend entirely through portions of the current spreading layer 54 and the p-type layer 16-2. In certain embodiments, the current spreading layer 54 and the p-type layer 16-2 may be continuously formed around perimeters of the first openings 58 outside the plane of the cross-sectional view of FIG. 10D.

FIG. 10E is a cross-sectional view of the LED chip 52 of FIG. 10D at a subsequent fabrication step where a second etch mask 60 is selectively formed over portions of the first active LED structure 12 for further defining individual light-emitting junctions. The second etch mask 60 may cover the current spreading layer 54, the p-type layer 16-2, and the first openings 58.

FIG. 10F is a cross-sectional view of the LED chip 52 of FIG. 10E at a subsequent fabrication step where individual first light-emitting junctions 16 are defined after a second etching step. The second etching step removes portions of the n-type layer 16-1 that are uncovered by the second etch mask 60 of FIG. 10E. In this manner, the individual first light-emitting junctions 16, as illustrated by the superimposed dashed-line boxes, are defined on the substrate 26 in a spaced-apart manner. The first light-emitting junctions 16 are thereby formed from the same active LED structure 12, including separate portions of the same n-type layer 16-1, separate portions of the same p-type layer 16-2, and separate portions of the same active layer that is between the n-type layer 16-1 and the p-type layer 16-2. Sufficient lateral spacing between the first light-emitting junctions 16 may be provided so that later-formed second light-emitting junctions may be positioned to be registered between neighboring first light-emitting junctions 16. In certain embodiments, the lateral spacing S between neighboring first light-emitting junctions 16 may be at least 50%, or at least 75%, or at least 100%, or up to 200% of a lateral width W of each individual first light-emitting junction 16. Such lateral spacing percentages may also be formed relative to lateral widths of later-formed second light-emitting junctions. While a single first opening 58 is shown for each light-emitting junction 16, multiple first openings 58 may also be provided to contact the n-type layer 16-1 at multiple locations within each light-emitting junction 16.

FIG. 10G is a cross-sectional view of the LED chip 52 of FIG. 10F at a subsequent fabrication step after multiple passivation and metallization layers are formed to provide electrical connections to the light-emitting junctions 16. FIG. 10G further illustrates an expanded portion of one of the light-emitting junctions 16 of the LED chip 52. As illustrated, a first reflective layer 62 may be formed to cover portions of the substrate 26 and the p-type layer 16-2, and the current spreading layer 54 when present. The first reflective layer 62 may comprise many different materials that provide an index of refraction step with the materials of the p-type layer 16-2 to promote increased reflectivity. In certain embodiments, the first reflective layer 62 comprises a dielectric material, such as silicon dioxide ($SiO_2$) and/or silicon nitride (SIN). It is understood that many dielectric materials can be used such as SIN, $SiN_x$, $Si_3N_4$, Si, germanium (Ge), $SiO_2$, $SiO_x$, titanium dioxide ($TiO_2$), tantalum pentoxide ($Ta_2O_5$). ITO, magnesium oxide ($MgO_x$), zinc oxide (ZnO), and combinations thereof. In certain embodiments, the first reflective layer 62 may include multiple alternating layers of different dielectric materials, e.g., alternating layers of $SiO_2$ and SiN that symmetrically repeat or are asymmetrically arranged.

With continued reference to FIG. 10G, the LED chip 52 may further include a second reflective layer 64 that is on the first reflective layer 62 such that the first reflective layer 62 is arranged between the p-type layer 16-2 and the second reflective layer 64. The second reflective layer 64 may include a metal layer that is configured to reflect light that may pass through the first reflective layer 62. The second reflective layer 64 may comprise many different materials such as Ag, gold (Au), Al, nickel (Ni), titanium (Ti), or combinations thereof. The second reflective layer 64 may include or form one or more reflective layer interconnects 64' that provide one or more electrically conductive paths through the first reflective layer 62 to the p-type layer 16-2, or the current spreading layer 54 when present. The reflective layer interconnects 64' may be formed in openings or holes distributed across the first reflective layer 62. Certain embodiments may also comprise an adhesion layer 66 that is positioned at one or more interfaces between the first reflective layer 62 and the second reflective layer 64 to promote improved adhesion therebetween. Many different materials can be used for the adhesion layer 66, such as titanium oxide (TiO, $TiO_2$), titanium oxynitride (TiON, $Ti_xO_yN$), tantalum oxide (TaO, $Ta_2O_5$), tantalum oxynitride (TaON), aluminum oxide (AIO, $Al_xO_y$) or combinations thereof, with a preferred material being TION, AIO, or $Al_xO_y$. In certain embodiments, the adhesion layer comprises $Al_xO_y$, where $1 \leq x \leq 4$ and $1 \leq y \leq 6$. In certain embodiments, the adhesion layer comprises $Al_xO_y$, where x=2 and y=3, or $Al_2O_3$. A first passivation layer 68 may be formed that effectively covers the LED chip 52 to protect and provide electrical insulation. The first passivation layer 68 may comprise many different materials, such as a dielectric material including but not limited to silicon nitride. In certain embodiments, the first passivation layer 68 is a single layer, and in other embodiments, the first passivation layer 68 comprises a plurality of layers. One or more p-contact interconnects 70 may be formed to extend through the first passivation layer 68 to provide part of an electrical connection to the p-type layer 16-2 by way of the second reflective layer 64 and the current spreading layer 54. Additionally, one or more n-contact interconnects 72 may be formed to extend through the first passivation layer 68 to provide part of an electrical connection to the n-type layer 16-1.

FIG. 10H is a cross-sectional view of the LED chip 52 of FIG. 10G at a subsequent fabrication step after a second passivation layer 74 is formed on the LED chip 52. The second passivation layer 74 may be blanket deposited to conformally cover the LED chip 52 as an overgrowth layer. In certain embodiments, the second passivation layer 74 comprises one or more of SiO$_2$, SiN, or SiON, among others.

FIG. 10I is a cross-sectional view of the LED chip 52 of FIG. 10H at a subsequent fabrication step after planarization of the second passivation layer 74. The second passivation layer 74 may exhibit topography as it conforms to the underlying structure of the LED chip 52. Accordingly, the planarization step may form a smooth and planar surface ready for bonding in later fabrication steps.

FIG. 10J is a cross-sectional view of the LED chip 52 of FIG. 10I at a subsequent fabrication step after bonding to a temporary substrate 76. As illustrated, the second passivation layer 74 may be bonded to the temporary substrate. In certain embodiments, such bonding may comprise use of an adhesive, such as a polymer adhesive, fusion bonding, anodic bonding, or eutectic bonding. The temporary substrate 76 may include many different materials, such as sapphire, glass, or other ceramic materials.

FIG. 10K is a cross-sectional view of the LED chip 52 of FIG. 10J at a subsequent fabrication step after removal of the substrate 26. By relying on the temporary substrate 76 for mechanical support, the substrate 26 may be removed by various techniques, including laser lift-off, chemical etching of a sacrificial layer between the n-type layer 16-1 and the substrate 26, or mechanical grinding and etching combinations.

FIG. 10L is a cross-sectional view of the LED chip 52 of FIG. 10K at a subsequent fabrication step after a first bonding layer 78 is formed. The first bonding layer 78 may be provided on a side of the first active LED structure 12 such that the first active LED structure 12 is between the temporary substrate 76 and the first bonding layer 78. The first bonding layer 78 may comprise one or more of SiO$_2$, SiN, or SiON, among others.

FIG. 10M is a cross-sectional view of the LED chip 52 of FIG. 10L at a subsequent fabrication step for bonding the first active LED structure 12 to the second active LED structure 14. The second active LED structure 14 may be formed in a similar manner as described according to the fabrication sequence of FIGS. 10A to 101. In this manner, the second active LED structure 14 is formed on its own substrate 80, such as a growth substrate, and may include separate portions of the same p-type layer 20-1, the same n-type layer 20-2, the same active layer that is between p-type layer 20-1 and the n-type layer 20-2, and optionally the current spreading layer 54. The second active LED structure 14 is patterned into the second light-emitting junctions 20 that are laterally spaced apart from one another. A second bonding layer 82, or another passivation layer, may be formed and planarized on the second active LED structure 14 in a similar manner described above for the first bonding layer 78. As illustrated in FIG. 10M, the first and second active LED structures 12, 14 are positioned to be bonded to one another by the first and second bonding layers 78, 82.

FIG. 10N is a cross-sectional view of the LED chip 52 of FIG. 10M at a subsequent fabrication step after bonding the first active LED structure 12 to the second active LED structure 14. The first and second bonding layers 78, 82 may be bonded together by fusion bonding. In other embodiments, the first and second bonding layers 78, 82 may comprise additional layers, such as a stack of dielectric layers of various indexes of refraction that form a dielectric filter. For example, the dielectric filter may include a band-pass filter that permits light from the first active LED structure 12 to pass therethrough while not allowing light of the second active LED structure 14 to pass. In this regard, when the LED chip 52 is later flip-chip mounted and the substrate 80 forms the primary emission face, light from the second active LED structure 14 may be prevented from back-propagating through the first and second bonding layers 78, 82 and increasing cross-talk with light from the first active LED structure 12.

FIG. 10O is a cross-sectional view of the LED chip 52 of FIG. 10N at a subsequent fabrication step after removal of the temporary substate 76. In certain embodiments, the temporary substrate 76 may be removed by mechanical removal, chemical removal, or combinations thereof. As illustrated, lateral widths of the second light-emitting junctions 20 may be provided to be less than or equal to a lateral width of separation between neighboring ones of the first light-emitting junctions 16 to allow unobstructed pathways of light. In other embodiments, the lateral widths of the first or second light-emitting junctions 16, 20 may be larger than lateral widths of separation of the other of the first or second light-emitting junctions 16, 20 to ensure full light coverage along the LED chip 52.

FIG. 10P is a cross-sectional view of the LED chip 52 of FIG. 10O at a subsequent fabrication step after etching is performed through a third etch mask 84 to provide openings through the second passivation layer 74 to provide access to the first and second active LED structures 12, 14. As illustrated, the second passivation layer 74 may be etched to provide access to the p-contact interconnects 70 and the n-contact interconnects 72 of each of the first and second light-emitting junctions 16, 20. In certain embodiments, the masking and etching step illustrated in FIG. 10P may be repeated twice to account for the different etching depths required for the first and second light-emitting junctions 16, 20.

FIG. 10Q is a cross-sectional view of the LED chip 52 of FIG. 10P at a subsequent fabrication step after electrically conductive vias are formed through the openings formed in the etching step of FIG. 10P. The electrically conductive vias form extensions of the n-contact interconnects 72 and the p-contact interconnects 70 that extend through the second passivation layer 74. In this manner, the n-contact interconnects 72 and the p-contact interconnects 70 may be accessible along a same horizontal plane of the LED chip 52.

FIG. 10R is a cross-sectional view of the LED chip 52 of FIG. 10P at a subsequent fabrication step after the p-contacts 22 and the n-contacts 24 have respectively been coupled to the p-contact interconnects 70 and the n-contact interconnects 72. The third etch mask 84 of FIG. 10P may be removed before the p-contacts 22 and the n-contacts 24 are formed. In this manner, the p-contacts 22 and the n-contacts 24 are provided along a same horizontal plane of the LED chip 52 to facilitate flip-chip mounting. The p-contacts 22 and the n-contacts 24 may further extend laterally on a surface of the second passivation layer 74. Accordingly, the face of the LED chip 52 with the p-contacts 22 and the n-contacts 24 forms the primary mounting face that is configured to be mounted to another surface, such as a printed circuit board with corresponding electrical traces. In certain embodiments, a single one of the p-contacts 22 may be electrically coupled to multiple p-contact interconnects 70, such as multiple p-contact interconnects 70 of a same one of the first or second light-emitting junctions 16, 20. In further embodiments, arrangements of the p-contacts 22 and the n-contacts 24 relative to the p-contact interconnects 70 and the n-contact interconnects 72 may be selected to provide individually addressable connections or common connections for the first and second light-emitting junctions 16, 20.

As illustrated in FIG. 10R, the first light-emitting junctions 16 are provided in a first pattern and the second light-emitting junctions 20 are provided in a second pattern along different horizontal planes within the LED chip 52. The first and second patterns may be such that the first light-emitting junctions 16 are vertically and horizontally offset from the second light-emitting junctions 20. This allows at least a portion of the light from the first light-emitting junctions 16 to follow a direct path or straight-line path through the second active LED structure 14 and out of the substrate 80 without passing through any of the second light-emitting junctions 20. In certain embodiments, a lateral width of the second light-emitting junctions 20 may be less than or equal to a lateral width of separation between neighboring ones of the first light-emitting junctions 16.

Figure 11:
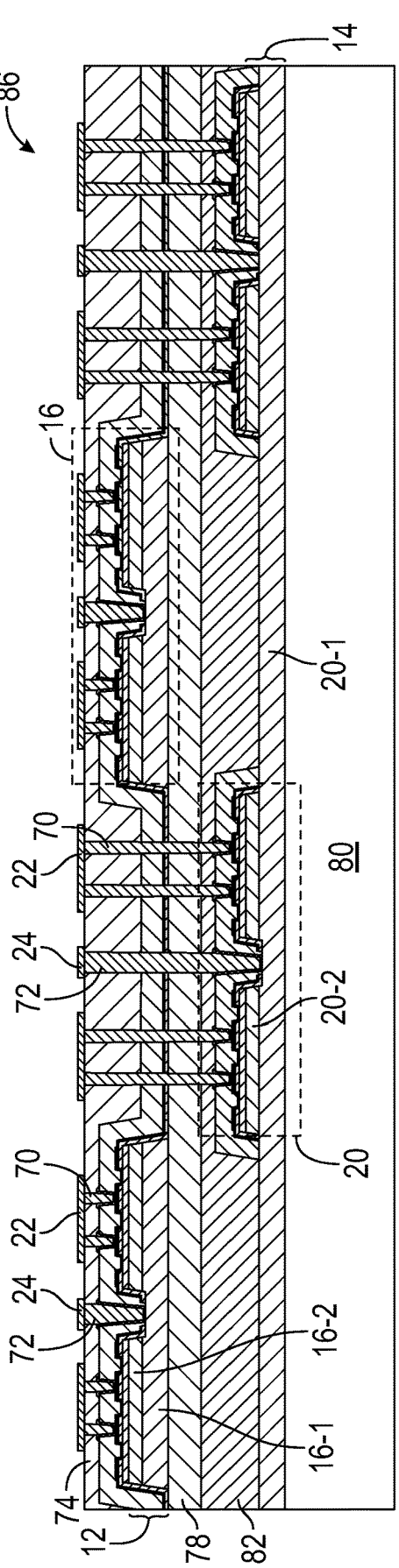
FIG. 11 is a cross-sectional view of an LED chip that is similar to the LED chip of FIG. 10R for embodiments where the n-type layer of the second active LED structure is continuous across the substrate.

FIG. 11 is a cross-sectional view of an LED chip 86 that is similar to the LED chip 52 of FIG. 10R for embodiments where the n-type layer 20-1 of the second active LED structure 14 is continuous across the substrate 80. In certain embodiments, such as when the second active LED structure 14 emits a wavelength of light that is less than a wavelength of light from the first active LED structure 12, the n-type layer 20-1 may be generally light-transparent to the light of the first active LED structure 12. Accordingly, the n-type layer 20-1 may not necessarily be removed in between neighboring ones of the second light-emitting junctions 20. As such, the n-type layer 20-1 may be continuous across the second light-emitting junctions 20 while the p-type layer 20-1, and corresponding active layer, is discontinuous across the second light-emitting junctions 20. A similar arrangement may be present with regard to the first active LED structure 12.

Figure 12:
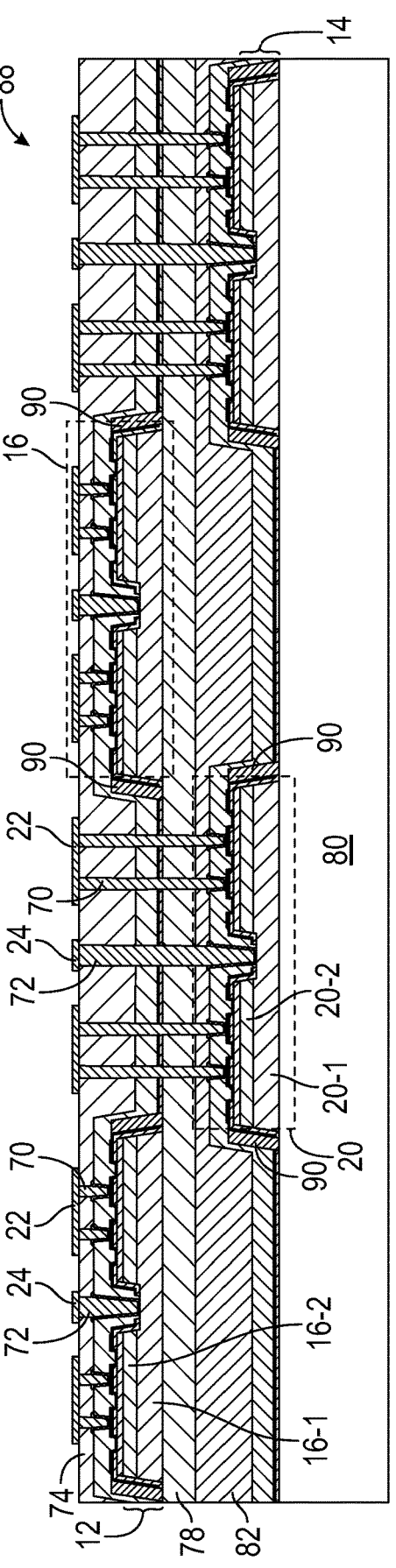
FIG. 12 is a cross-sectional view of an LED chip that is similar to the LED chip of FIG. 10R for embodiments that include one or more contrast-enhancing layers arranged between neighboring ones of the first light-emitting junctions and/or between neighboring ones of the second light-emitting junctions.

FIG. 12 is a cross-sectional view of an LED chip 88 that is similar to the LED chip 52 of FIG. 10R for embodiments that include one or more contrast-enhancing layers 90 arranged between neighboring ones of the first light-emitting junctions 16 and/or between neighboring ones of the second light-emitting junctions 20. The contrast-enhancing layers 90 may embody light-absorbing and/or light-reflecting layers arranged to provide increased contrast within the LED chip 88 by reducing or preventing lateral emissions from the first light-emitting junctions 16 and/or the second light-emitting junctions 20. The contrast-enhancing layers 90 may comprise light-absorbing materials such as Ti or alloys thereof, or the contrast-enhancing layers 90 may comprise light-reflective materials such as Ag and/or Al. In certain embodiments, the contrast-enhancing layers 90 may be deposited, or otherwise formed, along sidewalls of one or more of the first light-emitting junctions 16 and/or the second light-emitting junctions 20. Accordingly, light from each of the first light-emitting junctions 16 and/or the second light-emitting junctions 20 may escape the LED chip 88 through the substrate 80 with reduced cross-talk.

Figure 13:
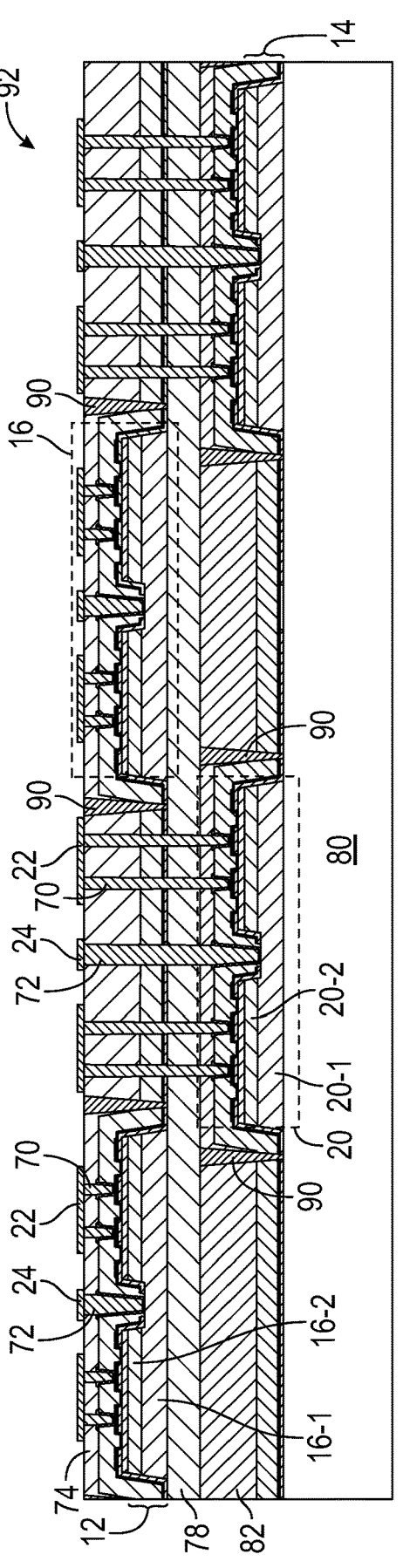
FIG. 13 is a cross-sectional view of an LED chip that is similar to the LED chip of FIG. 12 with an alternative arrangement of the contrast-enhancing layers.

FIG. 13 is a cross-sectional view of an LED chip 92 that is similar to the LED chip 88 of FIG. 12 with an alternative arrangement of the contrast-enhancing layers 90. As illustrated, the contrast-enhancing layers 90 may vertically extend within the LED chip 92 distances that exceed thicknesses of the first and second light-emitting junctions 16, 20. In this manner, the contrast-enhancing layers 90 may further restrict cross-talk within the LED chip 92. The contrast-enhancing layers 90 as illustrated in FIG. 13 may be formed by etching trenches into various layers and filling the trenches with contrast-enhancing materials before bonding the first and second active LED structures 12, 14 together.

Figure 14:
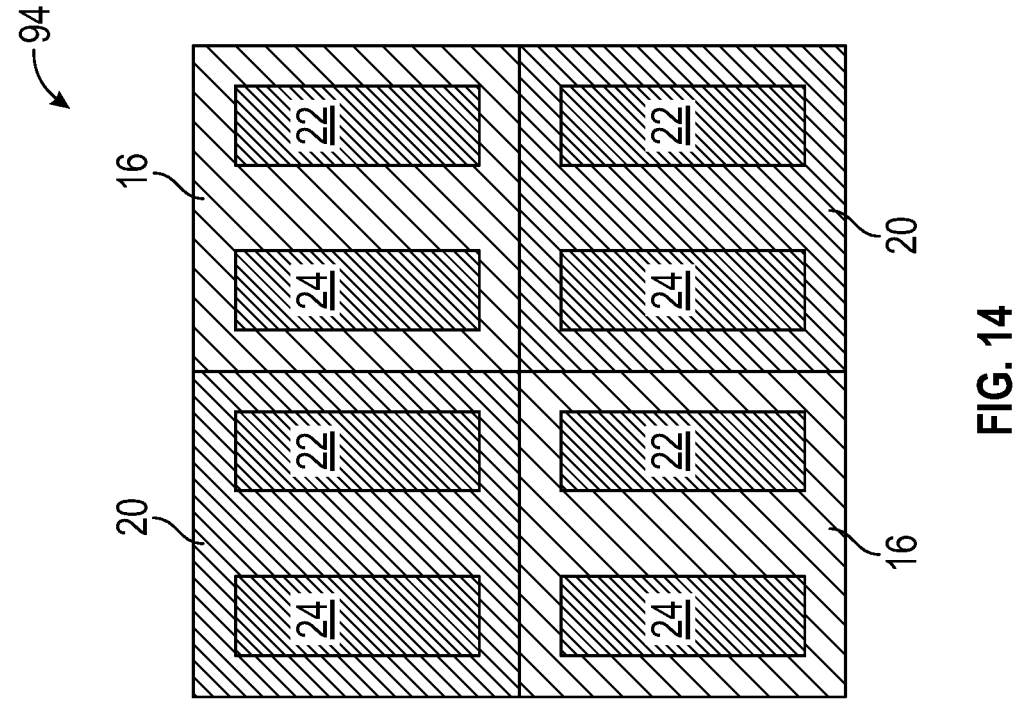
FIG. 14 is a bottom view of an LED chip that is similar to the LED chip of FIG. 10R for embodiments where each of the first and second light-emitting junctions are individually addressable.

FIG. 14 is a bottom view of an LED chip 94 that is similar to the LED chip 52 of FIG. 10R for embodiments where each of the first and second light-emitting junctions 16, 20 are individually addressable. For illustrative purposes, four total light-emitting junctions 16, 20 are illustrated; however, any number of light-emitting junctions may be present without deviating from the principles disclosed. As illustrated, each of the first light-emitting junctions 16 and each of the second light-emitting junctions 20 are arranged with their own p-contact 22 and n-contact 24 pair. Accordingly, separate anode and cathode electrical connections may be made to each of the first and second light-emitting junctions 16, 20 so that each junction 16, 20 may be electrically activated and deactivated independently of one another.

Figure 15:
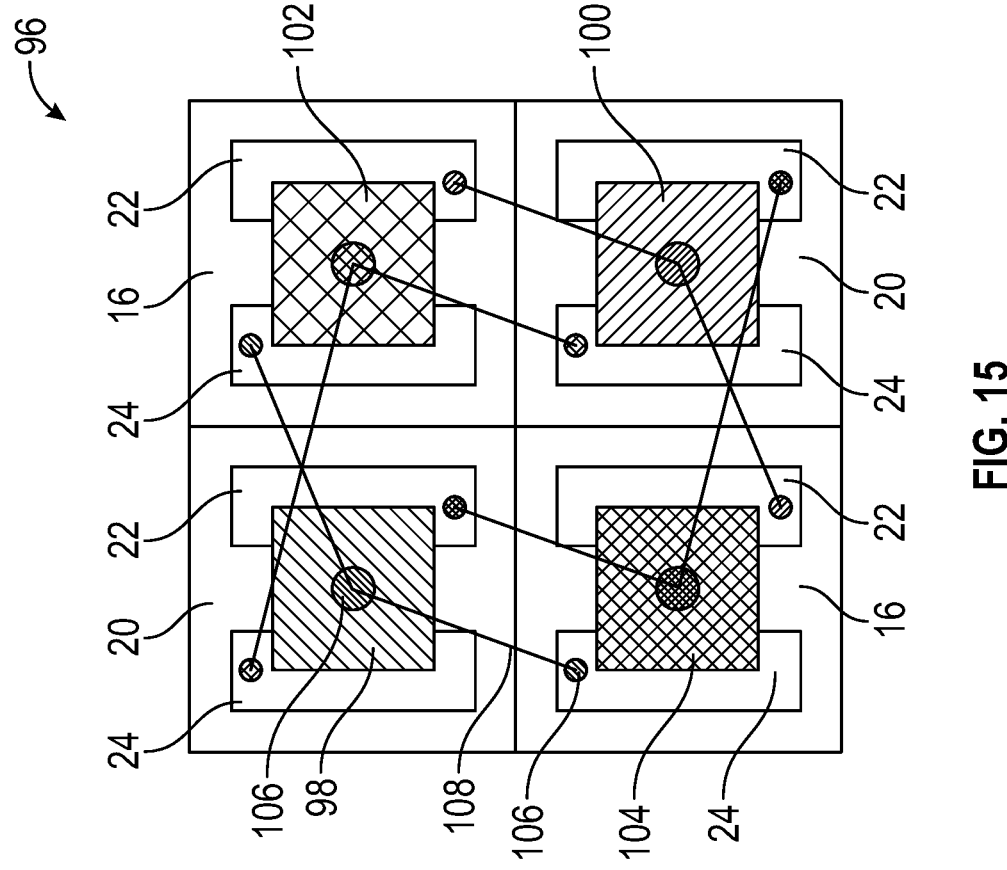
FIG. 15 is a bottom view of an LED chip that is similar to the LED chip of FIG. 14 and further includes additional layers of electrical pathways.

FIG. 15 is a bottom view of an LED chip 96 that is similar to the LED chip 94 and further includes additional layers of electrical pathways. The LED chip 94 may include the first and second light-emitting junctions 16, 20, p-contacts 22, and n-contacts 24 in a similar manner as described above for FIG. 14. For embodiments where common electrical connections are desired for one or more of the first and second light-emitting junctions 16, 20, additional electrically conductive pathways may be formed. In certain embodiments, the common electrical connections may be provided for multiple junctions formed from the same active LED structure where relative turn-on voltages may be substantially the same. In this regard, the LED chip 96 may include a first cathode bond pad 98 and a first anode bond pad 100 that provide electrical connections to multiple ones of the first light-emitting junctions 16. In a similar manner, a second cathode bond pad 102 and a second anode bond pad 104 are arranged to provide electrical connections to multiple ones of the second light-emitting junctions 20. For illustrative purposes, various vertical conductive pathways 106 as indicated by circles and lateral conductive pathways 108 as indicated by straight lines are illustrated to show electrically conductive pathways. The vertical conductive pathways 106 may comprise vias that extend in a direction perpendicular to the plane of view in FIG. 15. The lateral conductive pathways 106 may represent electrical traces formed between the various bond pads 98, 100, 102, 104 and the p- and n-contacts 22, 24. By way of example, the first cathode bond pad 98 is electrically coupled to the n-contact 24 of both first light-emitting junctions 16, and the first anode bond pad 100 is electrically coupled to the p-contact 22 of both first light-emitting junctions 16. Such electrical connections as illustrated in FIG. 15 may be scaled and/or repeated to provide common electrical connections to any number of first and/or second light-emitting junction 16, 20.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) chip comprising:
a first active LED structure comprising a first pattern of first light-emitting junctions that is configured to emit light of a first peak wavelength; and
a second active LED structure on the first active LED structure, the second active LED structure comprising a second pattern of second light-emitting junctions that is configured to emit light of a second peak wavelength that is different than the first peak wavelength, the second light-emitting junctions being positioned vertically and horizontally offset from the first light-emitting junctions;
wherein a lateral width of each second light-emitting junction is less than or equal to a lateral width of separation between neighboring ones of the first light-emitting junctions.

2. The LED chip of claim 1, wherein the first light-emitting junctions and the second light-emitting junctions are positioned such that at least a portion of the light of the second peak wavelength is able to follow a direct path through the first active LED structure without passing through any of the first light-emitting junctions.

3. The LED chip of claim 1, wherein the first pattern is inverse to the second pattern.

4. The LED chip of claim 1, wherein each first light-emitting junction of the first pattern of first light-emitting junctions is individually controllable.

5. The LED chip of claim 1, wherein:
the first active LED structure comprises a first n-type layer and a first p-type layer, and each first light-emitting junction comprises a separate portion of the first n-type layer and a separate portion of the first p-type layer; and
the second active LED structure comprises a second n-type layer and a second p-type layer, and each second light-emitting junction comprises a separate portion of the second n-type layer and a separate portion of the second p-type layer.

6. The LED chip of claim 5, wherein the first n-type layer of the first active LED structure is continuous across the first light-emitting junctions, and the first p-type layer of the first active LED structure is discontinuous across the first light-emitting junctions.

7. The LED chip of claim 1, further comprising:
a third active LED structure on the second active LED structure, the third active LED structure comprising a third pattern of third light-emitting junctions that is configured to emit light of a third peak wavelength that is different than the first peak wavelength and the second peak wavelength, the third light-emitting junctions being positioned vertically and horizontally offset from both the first light-emitting junctions and the second light-emitting junctions.

8. The LED chip of claim 7, wherein the first pattern, the second pattern, and the third pattern collectively form at least one of a grid pattern or a stripe pattern.

9. The LED chip of claim 1, further comprising a lumiphoric material registered with at least one of the first light-emitting junctions.

10. A light-emitting diode (LED) chip comprising:
a substrate;
a first active LED structure on the substrate, the first active LED structure comprising a first pattern of first light-emitting junctions that is configured to emit light of a first peak wavelength;

a second active LED structure on the first active LED structure, the second active LED structure comprising a second pattern of second light-emitting junctions that is configured to emit light of a second peak wavelength that is different than the first peak wavelength; and
electrical connections to each of the first light-emitting junctions and each of the second light-emitting junctions, the electrical connections being arranged such that the first active LED structure and the second active LED structure are between the electrical connections and the substrate.

11. The LED chip of claim 10, wherein the electrical connections comprise a plurality of p-contacts and a plurality of n-contacts, and each individual one of the first and second light-emitting junctions is electrically coupled to an individual p-contact of the plurality of p-contacts and an individual n-contact of the plurality of n-contacts.

12. The LED chip of claim 11, further comprising a passivation layer, wherein the plurality of p-contacts and the plurality of n-contacts are arranged to laterally extend on a surface of the passivation layer.

13. The LED chip of claim 12, further comprising:
at least one p-contact interconnect electrically coupled to each p-contact of the plurality of p-contacts, wherein the at least one p-contact interconnect extends through the passivation layer; and
at least one n-contact interconnect electrically coupled to each n-contact of the plurality of n-contacts, wherein the at least one n-contact interconnect extends through the passivation layer.

14. The LED chip of claim 10, wherein the first light-emitting junctions and the second light-emitting junctions are positioned such that at least a portion of the light of the second peak wavelength is able to follow a direct path through the first active LED structure without passing through any of the first light-emitting junctions.

15. The LED chip of claim 10, wherein:
the first active LED structure comprises a first n-type layer and a first p-type layer, and each first light-emitting junction comprises a separate portion of the first n-type layer and a separate portion of the first p-type layer; and
the second active LED structure comprises a second n-type layer and a second p-type layer, and each second light-emitting junction comprises a separate portion of the second n-type layer and a separate portion of the second p-type layer.

16. The LED chip of claim 10, further comprising one or more contrast-enhancing layers arranged between neighboring ones of the first light-emitting junctions or between neighboring ones of the second light-emitting junctions, the one or more contrast-enhancing layers comprising light-absorbing materials or light-reflective materials.

17. The LED chip of claim 16, wherein the one or more contrast-enhancing layers are arranged on sidewalls of the first light-emitting junctions or sidewalls of the second light-emitting junctions.

18. The LED chip of claim 16, wherein the one or more contrast-enhancing layers are arranged to vertically extend distances that exceed thicknesses of the first light-emitting junctions or the second light-emitting junctions.

* * * * *